US012281251B2

(12) United States Patent
Ge et al.

(10) Patent No.: US 12,281,251 B2
(45) Date of Patent: *Apr. 22, 2025

(54) ETCHING COMPOSITION AND METHOD FOR SELECTIVELY REMOVING SILICON NITRIDE DURING MANUFACTURE OF A SEMICONDUCTOR DEVICE

(71) Applicant: Versum Materials US, LLC, Tempe, AZ (US)

(72) Inventors: Jhih Kuei Ge, New Taipei (TW); Yi-Chia Lee, Chupei (TW); Wen Dar Liu, Chupei (TW); Aiping Wu, Chandler, AZ (US); Laisheng Sun, Gilbert, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 536 days.

This patent is subject to a terminal disclaimer.

(21) Appl. No.: 17/754,165

(22) PCT Filed: Sep. 28, 2020

(86) PCT No.: PCT/US2020/052999
§ 371 (c)(1),
(2) Date: Mar. 25, 2022

(87) PCT Pub. No.: WO2021/067150
PCT Pub. Date: Apr. 8, 2021

(65) Prior Publication Data
US 2022/0298182 A1 Sep. 22, 2022

Related U.S. Application Data

(60) Provisional application No. 62/908,083, filed on Sep. 30, 2019.

(51) Int. Cl.
C09K 13/06 (2006.01)
C07F 7/08 (2006.01)
C07F 9/06 (2006.01)
H01L 21/02 (2006.01)
H01L 21/311 (2006.01)

(52) U.S. Cl.
CPC ............ C09K 13/06 (2013.01); C07F 7/0838 (2013.01); C07F 9/06 (2013.01); H01L 21/0217 (2013.01); H01L 21/31111 (2013.01); H01L 21/0206 (2013.01); H01L 21/02164 (2013.01)

(58) Field of Classification Search
CPC .......... C09K 13/06; C07F 7/0838; C07F 9/06; H01L 21/0217; H01L 21/31111; H01L 21/0206; H01L 21/02164; H01L 21/021
See application file for complete search history.

(56) References Cited

U.S. PATENT DOCUMENTS

| | | | |
|---|---|---|---|
| 12,110,435 B2 * | 10/2024 | Ge | ............ C07F 7/0838 |
| 2004/0224528 A1 | 11/2004 | Mirth | |
| 2014/0102332 A1 | 4/2014 | Yoo et al. | |
| 2015/0111390 A1 | 4/2015 | Changchien et al. | |
| 2015/0159046 A1 | 6/2015 | Dinega et al. | |
| 2016/0017224 A1 | 1/2016 | Lee et al. | |
| 2016/0185595 A1 | 6/2016 | Chen et al. | |
| 2017/0062231 A1 | 3/2017 | Sato et al. | |
| 2017/0321121 A1 | 11/2017 | Yoo et al. | |
| 2018/0142151 A1 | 5/2018 | Lee et al. | |
| 2019/0136132 A1 * | 5/2019 | Han | .......... H01L 21/0217 |
| 2021/0363423 A1 * | 11/2021 | Hwang | ............ C09K 13/06 |

FOREIGN PATENT DOCUMENTS

| | | |
|---|---|---|
| CN | 108102654 A | 6/2018 |
| CN | 110021527 A | 7/2019 |
| CN | 110028971 A | 7/2019 |
| JP | 2004207731 A | 7/2004 |
| JP | 2017118092 A | 6/2017 |
| KR | 20170001801 A | 1/2017 |
| KR | 20170093430 A | 8/2017 |
| TW | 201525121 A | 7/2015 |

OTHER PUBLICATIONS

Intellectual Property Office of Singapore, Search Report, Application No. 11202202822T; Feb. 2, 2024.
International Search Report; PCT/US2020/052999; Jan. 27, 2021.
Search Report; ROC (Taiwan) Patent Application No. 109133617; Dec. 27, 2023.
The China National Intellectual Property Administration, Patent Search Report, Application No. 2020800684300, Oct. 28, 2023.
Notice of Reasons for Rejection, Patent Application No. 2023-165894, Jul. 23, 2024.

* cited by examiner

Primary Examiner — Duy Vu N Deo
Assistant Examiner — Christopher Remavege
(74) Attorney, Agent, or Firm — Versum Materials US, LLC; William T. Slaven, IV

(57) ABSTRACT

The disclosed and claimed subject matter is directed to an etching composition that includes (A) phosphoric acid and (B) a mixture that includes (i) a silicon-containing compound and (ii) an aqueous solvent. In some embodiments, the etching compositions include additional ingredients. The etching compositions are useful for the selective removal of silicon nitride over silicon oxide from a microelectronic device having such material(s) thereon during its manufacture.

23 Claims, No Drawings

ETCHING COMPOSITION AND METHOD FOR SELECTIVELY REMOVING SILICON NITRIDE DURING MANUFACTURE OF A SEMICONDUCTOR DEVICE

This application is a national stage application, filed under 35 U.S.C. § 371, of International Patent Application No. PCT/US2020/052999 (filed on 28 Sep. 2020) which claims the benefit of U.S. Provisional Patent Application No. 62/908,083 (filed on 30 Sep. 2019) each of which applications is incorporated herein by reference in their entirety.

BACKGROUND

Field

The disclosed and claimed subject matter relates to etching compositions, and more particularly, to a high-selectivity etching compositions capable of selectively removing a nitride film while minimizing the etch rate of an oxide film and to a method for fabricating a semiconductor, which includes an etching process employing the etching composition.

Related Art

Selective silicon nitride ($SiN_x$) sacrificial removal is one of the critical steps for 3D NAND memory device fabrication. After the etch process, $SiN_x$ is removed, leaving the silicon oxide ($SiO_x$) core with $SiO_x$ fins unchanged. Traditionally, an $SiN_x$ etch could be accomplished by hot phosphoric acid at 160° C., however, the selectivity of the $SiN_x$ etch relative to a silicon or silicon oxide material is generally low for advanced 3D NAND memory technology.

As semiconductor devices become more highly integrated, the reliability and electrical characteristics of the semiconductor devices are more susceptible to damage or deformation of the layers constituting the semiconductor device. Therefore, when an etching process is performed to remove a specific material layer selectively using an etchant, it is desirable that the etchant should have a higher etch selectivity with respect to other material layers and the etching process generate less byproduct to reduce process defects.

With such high integration, therefore, the material selectivity requirement for selective $SiN_x$ sacrificial removal in 3D NAND fabrication becomes more critical—to the point where it is desired to effectively leave the $SiO_x$ layer unchanged while etching the $SiN_x$ layer. Thus, there is a need in the art to further suppress the $SiO_x$ etch rate to achieve an even higher $SiN_x$ to $SiO_x$ selectivity.

SUMMARY

In one aspect, the disclosed and claimed subject matter provides an etching composition suitable for the selective removal of silicon nitride over silicon oxide from a microelectronic device, which includes:
A. phosphoric acid; and
B. mixture that includes and aqueous solvent and a silicon-containing compound (which also may be referred to as an organosilicon compound).

In some embodiments, the silicon-containing compound has Formula I:

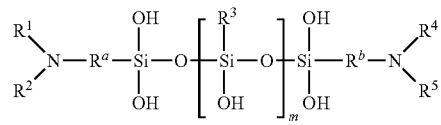

wherein:
(i) m=0-20,
(ii) each of $R^1$, $R^2$, $R^3$, $R^4$ and $R^5$ is independently selected from the group of hydrogen, a $C_1$ to $C_{10}$ linear alkyl group, a $C_1$ to $C_{10}$ linear alkyl group substituted with fluorine, a nitrogen-containing group, an oxygen-containing group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ─OH, and
(iii) each of $R^a$ and $R^b$ is independently selected from a $C_1$ to $C_{10}$ linear alkyl group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ─NH─$C_1$-$C_{10}$ alkyl, a $C_1$-$C_{10}$ alkyl substituted with ─OH.

In some embodiments, the silicon-containing compound has Formula II:

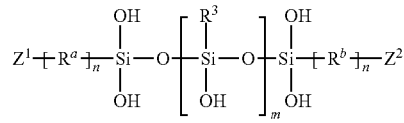

wherein:
(i) m=0-20,
(ii) n=0-20,
(iii) $R^3$ is selected from the group of hydrogen, a $C_1$ to $C_{10}$ linear alkyl group, a $C_1$ to $C_{10}$ linear alkyl group substituted with fluorine, a nitrogen-containing group, an oxygen-containing group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ─OH, $Z^1$ and $Z^2$, and
(iv) each of $R^a$ and $R^b$ is independently selected from a $C_1$ to $C_{10}$ linear alkyl group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ─NH─$C_1$-$C_{10}$ alkyl, a $C_1$-$C_{10}$ alkyl substituted with ─OH,
(v) $Z^1$ and $Z^2$ are each independently selected from:
a.

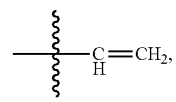

b.

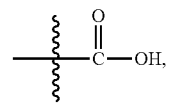

c. $\text{\textendash}\!\!\!\!\text{\textendash} N^+(CH_3)_3 Cl^-$, and d. $\text{\textendash}\!\!\!\!\text{\textendash} CH(OH)CH_2OH$.

In some embodiments, the silicon-containing compound has Formula III:

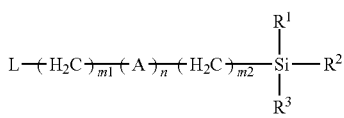

wherein:

(i) m1 and m2 each equal 0-10 provided and at least one of m1 and m2 is ≥1, (ii) n=0 or 1, (iii) each of $R^1$, $R^2$ and $R^3$ is independently selected from the group of hydrogen, a $C_1$ to $C_6$ linear alkyl group, a $C_3$ to $C_6$ branched alkyl group and a $\text{\textendash}\!\!\!\!\text{\textendash} O\text{\textendash}C_1$ to $C_6$ linear alkyl group, (iv) A is selected from:

a.

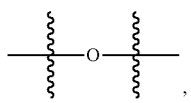 [SMILES: *O*]

b.

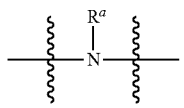

wherein $R^a$ is selected from hydrogen, a $C_1$ to $C_6$ linear alkyl group, a $C_3$ to $C_6$ branched alkyl group, c.

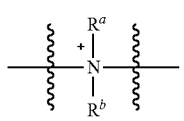

wherein $R^a$ and $R^b$ are each independently selected from hydrogen, a $C_1$ to $C_6$ linear alkyl group, a $C_3$ to $C_6$ branched alkyl group and d.

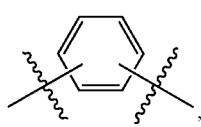

(v) L is selected from:

a.

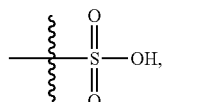

b.

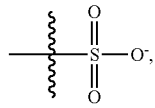

c.

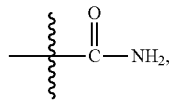

d.

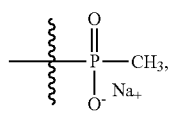

e.

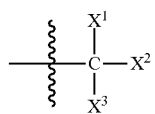

wherein each of $X^1$, $X^2$ and $X^3$ is independently selected from Cl, Br, F or I, f.

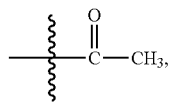

g.

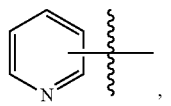

h.

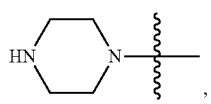

i.

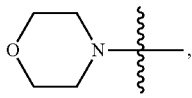

and j.

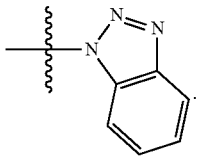 [SMILES: *n1nnc2ccccc21]

In some embodiments, the etching composition includes approximately 70% or less by weight of neat phosphoric acid. In a further aspect of this embodiment, the etching composition includes approximately 60% or less by weight of neat phosphoric acid. In a further aspect of this embodiment, the etching composition includes approximately 30% or greater by weight of the mixture. In a further aspect of this embodiment, the etching composition includes approximately 40% or greater by weight of the mixture. In a further aspect of this embodiment, the neat phosphoric acid and the mixture combine to constitute approximately 100 wt % of the etching composition.

In some embodiments, the etching composition includes greater than approximately 70% by weight of neat phosphoric acid. In a further aspect of this embodiment, the etching composition includes greater than approximately 75% by weight of neat phosphoric acid. In a further aspect of this embodiment, the etching composition includes approximately 30% or less by weight of the mixture. In a further aspect of this embodiment, the etching composition includes approximately 25% or greater by weight of the mixture. In a further aspect of this embodiment, the neat phosphoric acid and the mixture combine to constitute approximately 100 wt % of the etching composition.

In some embodiments, the mixture further includes at least one additional acid other than phosphoric acid. In one aspect of this embodiment, the at least one additional is one of nitric acid ($HNO_3$), sulfuric acid ($H_2SO_4$), hydrochloric acid (HCl) and a sulfonic acid (e.g., methane sulfuric acid ($CH_3SO_3H$)). In a further aspect, the at least one additional acid includes sulfuric acid.

In another aspect, the disclosed and claimed subject matter provides a method of selectively enhancing the etch rate of silicon nitride relative to silicon dioxide on a composite semiconductor device including silicon nitride and silicon dioxide, the method including the steps of: contacting the composite semiconductor device including silicon nitride and silicon dioxide with the etching composition.

In some embodiments, the compounds of Formula I, Formula II and/or Formula III can include optional groups such as, an epoxy group, a styryl group, a methacyloxy group, an acyloxy group, a ureide group, an isocycanate group, an isocyanurate group and a mercapto group in place of one or more hydrogens.

The embodiments of the disclosed and claimed subject matter can be used alone or in combinations with each other.

DETAILED DESCRIPTION

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the disclosed and claimed subject matter (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosed and claimed subject matter and does not pose a limitation on the scope of the disclosed and claimed subject matter unless otherwise claimed. No language in the specification should be construed as indicating any non-claimed element as essential to the practice of the disclosed and claimed subject matter.

Preferred embodiments of this disclosed and claimed subject matter are described herein, including the best mode known to the inventors for carrying out the disclosed and claimed subject matter. Variations of those preferred embodiments may become apparent to those of ordinary skill in the art upon reading the foregoing description. The inventors expect skilled artisans to employ such variations as appropriate, and the inventors intend for the disclosed and claimed subject matter to be practiced otherwise than as specifically described herein. Accordingly, this disclosed and claimed subject matter includes all modifications and equivalents of the subject matter recited in the claims appended hereto as permitted by applicable law. Moreover, any combination of the above-described elements in all possible variations thereof is encompassed by the disclosed and claimed subject matter unless otherwise indicated herein or otherwise clearly contradicted by context.

The disclosed and claimed subject matter relates generally to compositions useful for the selective removal of silicon nitride over silicon oxide from a microelectronic device having such material(s) thereon during its manufacture.

For ease of reference, "microelectronic device" or "semiconductor substrates" correspond to semiconductor wafers, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly. The microelectronic device or semiconductor substrates may include low-k dielectric material, barrier materials, and metals, such as, AlCu alloys, W, Ti, TiN, as well as other materials thereon.

As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, the term "barrier material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, and other refractory metals and their nitrides and silicides.

"Substantially free" is defined herein as less than 2 wt. %, preferably less than 1 wt. %, more preferably less than 0.5 wt. %, and most preferably less than 0.1 wt. %. "Substantially free" also includes 0.0 wt. %. The term "free of" means 0.0 wt. %.

As used herein, the terms "about" and "approximately" are each intended to correspond to ±5% of the stated value.

As used herein, "neat" refers to the weight % amount of an undiluted acid or other material. For example, the inclusion 100 g of 85% phosphoric acid constitutes 85 g of the acid and 15 grams of diluent.

In addition to known and understood representations for the attachment point of a covalent bond, the notation "$\dashv$" is intended to also designate the attachment point of a covalent bond.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed. Note all defined weight percents of the components unless otherwise indicated are based on the total weight of the composition. Further, all weight percents unless otherwise indicated are "neat" meaning that they do not include the aqueous composition in which they are present when added to the composition. Any reference to "at least one" could be substituted with "one or more". "At least one" and/or "one or more" includes "at least two" or "two or more" and "at least three" and "three or more" and so on.

In the broad practice of the disclosed and claimed subject matter pertains to the above-described etching composition which includes, or consists essentially of, or consists of (A) phosphoric acid and (B) a mixture of a silicon-containing compound as disclosed herein and an aqueous solvent. In some aspect, the etching compositions can include other ingredients.

In some embodiments, the etching compositions disclosed herein are formulated to be substantially free of at least one of the following chemical compounds: hydrogen peroxide and other peroxides, ammonium ions, fluoride ions, inorganic base, quaternary ammonium hydroxide, metal-containing chemicals, and abrasives.

In a further embodiment, the etching compositions consist essentially of (i) phosphoric acid and (ii) the mixture of the silicon-containing compound as disclosed herein and an aqueous solvent. In such an embodiment, the combined amounts of (i) and (ii) do not equal 100% by weight, and can include other ingredients that do not materially change the effectiveness of the etching compositions.

In another embodiment, the etching compositions consist of (i) phosphoric acid and (ii) the silicon-containing compound as disclosed herein and the aqueous solvent in varying concentrations. In such an embodiment, the combined amounts of (i) and (ii) equal approximately 100% by weight but may include other small and/or trace amounts of impurities that are present in such small quantities that they do not materially change the effectiveness of the composition. For example, in one such embodiment, the etching composition can contain 2% by weight or less of impurities. In another embodiment, the etching composition can contain 1% by weight or less than of impurities. In a further embodiment, the etching composition can contain 0.05% by weight or less than of impurities.

When referring to compositions of the inventive composition described herein in terms of weight %, it is understood that in no event shall the weight % of all components, including non-essential components, such as impurities, add to more than 100 weight %. In compositions "consisting essentially of" recited components, such components may add up to 100 weight % of the composition or may add up to less than 100 weight %. Where the components add up to less than 100 weight %, such composition may include some small amounts of a non-essential contaminants or impurities. For example, in one such embodiment, the etching composition can contain 2% by weight or less of impurities. In another embodiment, the etching composition can contain 1% by weight or less than of impurities. In a further embodiment, the etching composition can contain 0.05% by weight or less of impurities. In other such embodiments, the ingredients can form at least 90 wt %, more preferably at least 95 wt %, more preferably at least 99 wt %, more preferably at least 99.5 wt %, most preferably at least 99.9 wt %, and can include other ingredients that do not material affect the performance of the etching compositions. Otherwise, if no significant non-essential impurity component is present, it is understood that the combination of all essential constituent components will essentially add up to 100 weight %.

Compositions

As noted above, the disclosed and claimed subject matter pertains to etching compositions which includes, or consists essentially of, or consists of (A) phosphoric acid and (B) a mixture of a silicon-containing compound as disclosed herein and an aqueous solvent. In some aspect, the etching compositions can include other ingredients.

Ingredients

A. Phosphoric Acid

The etching compositions of the disclosed and claimed subject matter include phosphoric acid. Commercial grade phosphoric acid can be used. Typically, the commercially available phosphoric acid is available as 80% to 85% aqueous compositions. In a preferred embodiment electronic grade phosphoric acid compositions are employed wherein such electronic grade compositions typically have a particle count below 100 particles/ml, and wherein the size of the particles is less than or equal to 0.5 microns and metallic ions are present in the acid in the low parts per million to parts per billion level per liter. In certain embodiments, no other inorganic acids such as, for example, hydrofluoric acid, nitric acid or mixtures thereof are added to the composition of the disclosed and claimed subject matter.

Phosphoric acid (on a neat basis) is included in an amount in a range having start and end points selected from the following list of weight percents: about 40% to about 95%, 45% to about 90% or 50% to about 90% or 55% to about 85% by weight of the composition. The phosphoric acid may also be present in an amount defined by the following list of weight percents: 30, 35, 37, 40, 42, 45, 47, 50, 52, 55, 57, 60, 62, 65, 68, 70, 72, 75, 78, 80, 82, 85, 88, 90, 92, and 95.

In some embodiments, the content of the neat phosphoric acid is approximately 70% or less by weight. In a further aspect of this embodiment, the content of the neat phosphoric acid is approximately 60% or less by weight.

In some embodiments, the content of the neat phosphoric acid is greater than approximately 70% by weight. In a further aspect of this embodiment, the content of the neat phosphoric acid is greater than approximately 75% by weight.

B. Mixture

As noted above, the etching compositions include a mixture of (I) a silicon-containing compound as disclosed herein and (II) an aqueous solvent.

I. Silicon-Containing Compound

The amount of the silicon-containing compound will range from about 0.001% to about 15% by weight of the etching composition. Preferably, the silicon-containing compound constitutes from about 0.1% to about 10% by weight of the etching composition. The weight-percents, unless otherwise indicated, including the just-described weight percents of the silicon-containing compound added to the composition are on a neat basis. In alternative embodiments, the silicon-containing compound may be present in amount within a range with start and endpoints defined by the following list of weight percents 0.001, 0.01, 0.1, 0.2, 0.3, 0.4, 0.5, 0.6, 0.7, 0.8, 0.9, 1, 1.2, 1.5, 1.7, 2, 2.2, 2.5, 2.7, 3, 3.2, 3.5, 3.7, 4, 4.2, 4.5, 4.7, 5, 5.2, 5.5, 5.7, 6, 6.2, 6.5, 6.8, 7, 7.2, 7.5, 7.8, 8, 8.2, 8.5, 8.8, 9, 9.2, 9.5, 10, 12, 15, 17, and 20.

In some embodiments, the silicon-containing compound has Formula I:

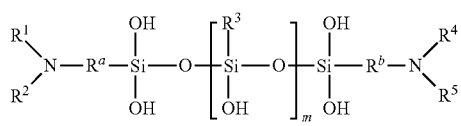

wherein:
(i) m=0-20,
(ii) each of $R^1$, $R^2$, $R^3$, $R^4$ and $R^5$ is independently selected from the group of hydrogen, a $C_1$ to $C_{10}$ linear alkyl group, a $C_1$ to $C_{10}$ linear alkyl group substituted with fluorine, a nitrogen-containing group, an oxygen-containing group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ⸦OH, and
(iii) each of $R^a$ and $R^b$ is independently selected from a $C_1$ to $C_{10}$ linear alkyl group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ⸦NH—$C_1$-$C_{10}$ alkyl, a $C_1$-$C_{10}$ alkyl substituted with ⸦OH.

In some embodiments of the etching composition that include the silicon-containing compound of Formula I, each of $R^1$, $R^2$, $R^3$, $R^4$ and $R^5$ is the same. In a further aspect of this embodiment, each of $R^2$, $R^3$, $R^4$ and $R^5$ is hydrogen.

In some embodiments of the etching composition that include the silicon-containing compound of Formula I, at least one of $R^1$, $R^2$, $R^3$, $R^4$ and $R^5$ is something other than hydrogen.

In some embodiments of the etching composition that include the silicon-containing compound of Formula I, m=0-20. In a further aspect of this embodiment, m is 0. In a further aspect of this embodiment, m is 1. In a further aspect of this embodiment, m is 2. In a further aspect of this embodiment, m is 3. In a further aspect of this embodiment, m is 4. In a further aspect of this embodiment, m is 5. In a further aspect of this embodiment, m is 6. In a further aspect of this embodiment, m is 7. In a further aspect of this embodiment, m is 8. In a further aspect of this embodiment, m is 9. In a further aspect of this embodiment, m is 10. In a further aspect of this embodiment, m is 11. In a further aspect of this embodiment, m is 12. In a further aspect of this embodiment, m is 13. In a further aspect of this embodiment, m is 14. In a further aspect of this embodiment, m is 15. In a further aspect of this embodiment, m is 16. In a further aspect of this embodiment, m is 17. In a further aspect of this embodiment, m is 18. In a further aspect of this embodiment, m is 19. In a further aspect of this embodiment, m is 20.

In some embodiments of the etching composition, the content of the silicon-containing compound of Formula I is approximately 5% or less by weight. In a further aspect of this embodiment, the content of the silicon-containing compound of Formula I is approximately 4% or less by weight. In a further aspect of this embodiment, the content of the silicon-containing compound of Formula I is approximately 3% or less by weight. In a further aspect of this embodiment, the content of the silicon-containing compound of Formula I is approximately 2% or less by weight. In a further aspect of this embodiment, the content of the silicon-containing compound of Formula I is approximately 1% or less by weight.

In some embodiments, the etching composition includes the silicon-containing compound of Formula I where (i) each of $R^a$ and $R^b$ is ⸦$C_3H_6$⸦, (ii) each of $R^1$, $R^2$, $R^4$ and $R^5$ is ⸦H and (iii) m=0.

In some embodiments, the etching composition includes the silicon-containing compound of Formula I where (i) each of $R^a$ and $R^b$ is ⸦$C_3H_6$⸦, (ii) each of $R^1$, $R^2$, $R^4$ and $R^5$ is ⸦H, (iii) m=0 and (iv) $R^3$=⸦$C_3H_6NH_2$.

In some embodiments, the etching composition includes the silicon-containing compound of Formula I where (i) each of $R^a$ and $R^b$ is ⸦NH—$C_2H_4$⸦, (ii) each of $R^1$, $R^2$, $R^3$, $R^4$ and $R^5$ is ⸦H and (iii) m=0.

In some embodiments, the silicon-containing compound has Formula II:

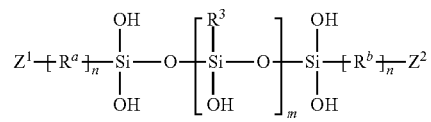

wherein:
(i) m=0-20,
(ii) n=0-20,
(iii) $R^3$ is selected from the group of hydrogen, a $C_1$ to $C_{10}$ linear alkyl group, a $C_1$ to $C_{10}$ linear alkyl group substituted with fluorine, a nitrogen-containing group, an oxygen-containing group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ⊣ OH, $Z^1$ and $Z^2$, and (iv) each of $R^a$ and $R^b$ is independently selected from a $C_1$ to $C_{10}$ linear alkyl group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ⊣ NH—$C_1$-$C_{10}$ alkyl, a $C_1$-$C_{10}$ alkyl substituted with ⊣ OH, (v) $Z^1$ and $Z^2$ are each independently selected from:

a.

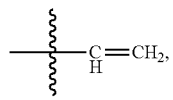

b.

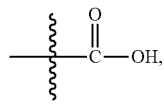 [SMILES: *C(=O)O]

c.

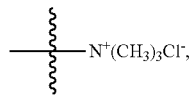

and d.

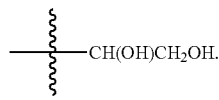

In some embodiments of the etching composition that include the silicon-containing compound of Formula II, m=0-20. In a further aspect of this embodiment, m is 0. In a further aspect of this embodiment, m is 1. In a further aspect of this embodiment, m is 2. In a further aspect of this embodiment, m is 3. In a further aspect of this embodiment, m is 4. In a further aspect of this embodiment, m is 5. In a further aspect of this embodiment, m is 6. In a further aspect of this embodiment, m is 7. In a further aspect of this embodiment, m is 8. In a further aspect of this embodiment, m is 9. In a further aspect of this embodiment, m is 10. In a further aspect of this embodiment, m is 11. In a further aspect of this embodiment, m is 12. In a further aspect of this embodiment, m is 13. In a further aspect of this embodiment, m is 14. In a further aspect of this embodiment, m is 15. In a further aspect of this embodiment, m is 16. In a further aspect of this embodiment, m is 17. In a further aspect of this embodiment, m is 18. In a further aspect of this embodiment, m is 19. In a further aspect of this embodiment, m is 20.

In some embodiments of the etching composition that include the silicon-containing compound of Formula II, n=0-20. In a further aspect of this embodiment, n is 0. In a further aspect of this embodiment, n is 1. In a further aspect of this embodiment, n is 2. In a further aspect of this embodiment, n is 3. In a further aspect of this embodiment, n is 4. In a further aspect of this embodiment, n is 5. In a further aspect of this embodiment, n is 6. In a further aspect of this embodiment, n is 7. In a further aspect of this embodiment, n is 8. In a further aspect of this embodiment, n is 9. In a further aspect of this embodiment, n is 10. In a further aspect of this embodiment, n is 11. In a further aspect of this embodiment, n is 12. In a further aspect of this embodiment, n is 13. In a further aspect of this embodiment, n is 14. In a further aspect of this embodiment, n is 15. In a further aspect of this embodiment, n is 16. In a further aspect of this embodiment, n is 17. In a further aspect of this embodiment, n is 18. In a further aspect of this embodiment, n is 19. In a further aspect of this embodiment, n is 20.

In some embodiments of the etching composition, the content of the silicon-containing compound of Formula II is approximately 5% or less by weight. In a further aspect of this embodiment, the content of the silicon-containing compound of Formula II is approximately 4% or less by weight. In a further aspect of this embodiment, the content of the silicon-containing compound of Formula II is approximately 3% or less by weight. In a further aspect of this embodiment, the content of the silicon-containing compound of Formula II is approximately 2% or less by weight. In a further aspect of this embodiment, the content of the silicon-containing compound of Formula II is approximately 1% or less by weight.

In some embodiments, the etching composition includes the silicon-containing compound of Formula II where In some embodiments, the etching composition includes the silicon-containing compound of Formula II where (i) m=0 and (ii) each of $Z^1$ and $Z^2$ is

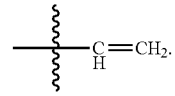

In some embodiments, the etching composition includes the silicon-containing compound of Formula II where (i) m=0, (ii) n=0 and (iii) each of $Z^1$ and $Z^2$ is

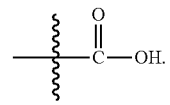

In some embodiments, the etching composition includes the silicon-containing compound of Formula II where (1) m=0, (ii) n=0 and (ii) each of $Z^1$ and $Z^2$ is ⊣ $N^+(CH_3)_3Cl^-$.

In some embodiments, the etching composition includes the silicon-containing compound of Formula II where (i) m=0, (ii) n=0 and (iii) each of $Z^1$ and $Z^2$ is

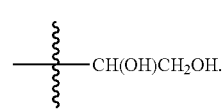

In some embodiments, the silicon-containing compound has Formula III:

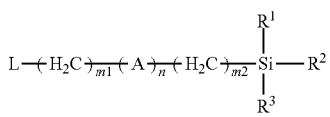

wherein:
(i) m1 and m2 each equal 0-10 provided and at least one of m1 and m2 is ≥1,
(ii) n=0 or 1,
(iii) each of $R^1$, $R^2$ and $R^3$ is independently selected from the group of hydrogen, hydroxyl, a $C_1$ to $C_6$ linear alkyl group, a $C_3$ to $C_6$ branched alkyl group and a ⁣—O—$C_1$ to $C_6$ linear alkyl group,
(iv) A is selected from:
a.

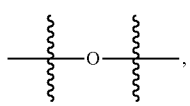 [SMILES: *O*]

b.

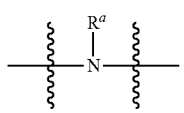

wherein $R^a$ is selected from hydrogen, a $C_1$ to $C_6$ linear alkyl group, a $C_3$ to $C_6$ branched alkyl group,
c.

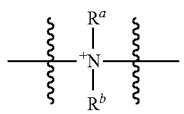

wherein $R^a$ and $R^b$ are each independently selected from hydrogen, a $C_1$ to $C_6$ linear alkyl group, a $C_3$ to $C_6$ branched alkyl group and
d.

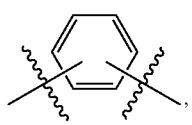

(v) L is selected from:
a.

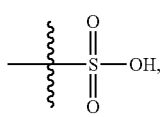 [SMILES: *S(=O)(=O)O]

b.

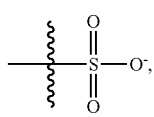

c.

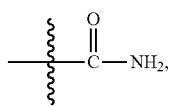

d.

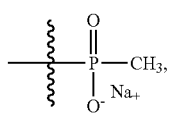 [SMILES: *P(C)(=O)[O-] ; [Na+]]

e.

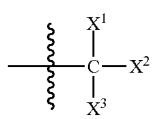

wherein each of $X^1$, $X^2$ and $X^3$ is independently selected from Cl, Br, F or I,
f.

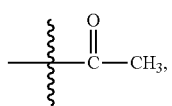

g.

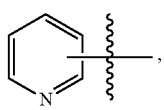

h.

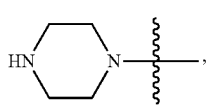

i.

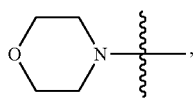

and
j.

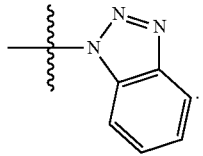 [SMILES: *n1nnc2ccccc21]

In some embodiments of the etching composition, the content of the silicon-containing compound of Formula III is approximately 5% or less by weight. In a further aspect of this embodiment, the content of the silicon-containing compound of Formula III is approximately 4% or less by weight. In a further aspect of this embodiment, the content of the silicon-containing compound of Formula III is approximately 3% or less by weight. In a further aspect of this embodiment, the content of the silicon-containing compound of Formula III is approximately 2% or less by weight. In a further aspect of this embodiment, the content of the silicon-containing compound of Formula III is approximately 1% or less by weight.

In some embodiments, the etching composition includes the silicon-containing compound of Formula III where (i) each of $R^1$, $R^2$ and $R^3$ is ⊹ $OCH_3$ and (ii) L is

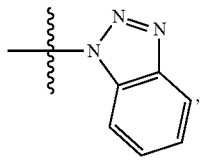 [SMILES: *n1nnc2ccccc21]

(iii) the sum of m1 and m2=1-5 and (iv) n=0. In a further aspect of this embodiment, the sum of m1 and m2=1. In a further aspect of this embodiment, the sum of m1 and m2=2. In a further aspect of this embodiment, the sum of m1 and m2=3. In a further aspect of this embodiment, the sum of m1 and m2=4. In a further aspect of this embodiment, the sum of m1 and m2=5.

In some embodiments, the etching composition includes the silicon-containing compound of Formula III where (i) each of $R^2$ and $R^3$ is ⊹ OH and (ii) the sum of m1 and m2=3, (iii) n=0 and (iv) L is

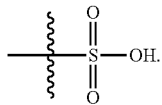

In some embodiments, the etching composition includes the silicon-containing compound of Formula III where (i) each of $R^1$, $R^2$ and $R^3$ is ⊹ $OCH_3$ and (ii) m2=3, (iii) n=1, (iv) A is

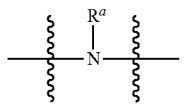

wherein $R^a$=⊹ H, (v) m1=0, and (vi) L is

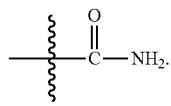

In some embodiments, the etching composition includes the silicon-containing compound of Formula III where (i) each of $R^2$ and $R^3$ is ⊹ OH and (ii) m2=3, (iii) n=1, (iv) A is

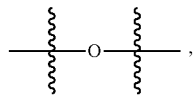

(v) m1=0, and (vi) L is

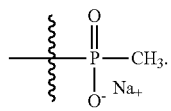 [SMILES: *P(C)(=O)[O-] ; [Na+]]

In some embodiments, the etching composition includes the silicon-containing compound of Formula III where (i) each of $R^1$, $R^2$ and $R^3$ is ⊹ $OCH_3$ and (ii) m2=3, (iii) n=1, (iv) A is

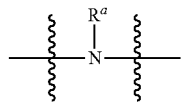

wherein $R^a$=⊹ H, (v) m1=0, and (vi) L is

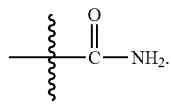 [SMILES: *C(N)=O]

In some embodiments, the etching composition includes the silicon-containing compound of Formula III where (i) each of $R^1$, $R^2$ and $R^3$ is —$OCH_3$ and (ii) the sum of m1 and m2=2, (iii) n=0 and (iv) L is

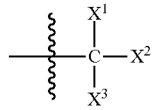

wherein each of $X^1$, $X^2$ and $X^3$ is F.

In some embodiments, the etching composition includes the silicon-containing compound of Formula III where (i) each of $R^1$, $R^2$ and $R^3$ is ⊹ $OCH_3$ and (ii) m2=3, (iii) n=1, (iv) A is

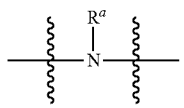

wherein $R^a = \text{—}H$, (v) m1=0, and (vi) L is

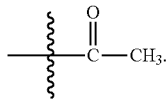

In some embodiments, the etching composition includes the silicon-containing compound of Formula III where (i) each of $R^1$, $R^2$ and $R^3$ is —OH and (ii) m2=2, (iii) n=1, (iv) A is

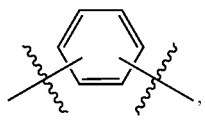

(v) m1=0 and (vi) L is

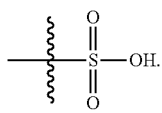 [SMILES: *S(=O)(=O)O]

In some embodiments, the etching composition includes the silicon-containing compound of Formula III where (i) each of $R^1$, $R^2$ and $R^3$ is —$OCH_3$ and (ii) m2=3, (iii) n=1, (iv) A is

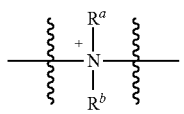

wherein $R^a$ and $R^b$ are —$CH_3$, (v) m1=3 and (vi) L is

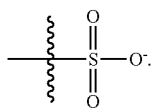

In some embodiments, the etching composition includes the silicon-containing compound of Formula III where (i) each of $R^1$, $R^2$ and $R^3$ is —$OCH_3$ and (ii) the sum of m1 and m2=2, (iii) n=0 and (iv) L is

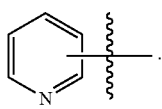

In some embodiments, the etching composition includes the silicon-containing compound of Formula III where (i) each of $R^1$, $R^2$ and $R^3$ is —$OCH_2CH_3$ and (ii) the sum of m1 and m2=3, (iii) n=0 and (iv) L is

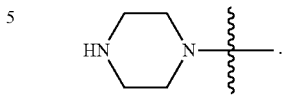

In some embodiments, the etching composition includes the silicon-containing compound of Formula III where (i) each of $R^1$, $R^2$ and $R^3$ is —$OCH_2CH_3$ and (ii) the sum of m1 and m2=1, (iii) n=0 and (iv) L is

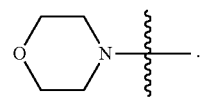

In some embodiments, the etching composition includes the silicon-containing compound of Formula III having the following structure:

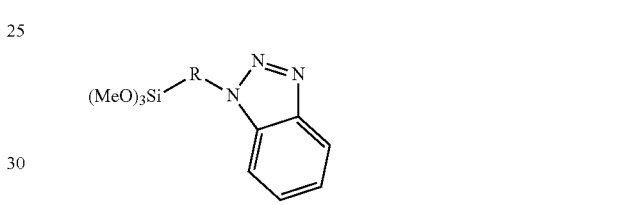

where R= —$(CH_2)_x$— and x=1-5. In a further aspect of this embodiment, x=1. In a further aspect of this embodiment, x=2. In a further aspect of this embodiment, x=3. In a further aspect of this embodiment, x=4. In a further aspect of this embodiment, x=5.

In some embodiments, the one or more silicon-containing compound(s) include a combination of one or more silicon-containing compound(s) having Formula 1, Formula II and/or Formula III.

II. Aqueous Solvent

The etching compositions of the present development are aqueous-based and include water. In the disclosed and claimed subject matter, water functions in various ways such as, for example, to dissolve one or more components of the composition, as a carrier of the components, as an aid in the removal of residue, as a viscosity modifier of the composition, and as a diluent. Preferably, the water employed in the etching composition is de-ionized (DI) water.

In some embodiments, the aqueous solvent comprises water. In a further aspect of this embodiment, the aqueous solvent consists essentially of water. In a further aspect of this embodiment, the aqueous solvent consists of water.

Water is included in an amount in a range having start and end points selected from the following list of weight percents: about 1% to about 50% by wt. of the etching composition. Other preferred embodiments of the disclosed and claimed subject matter include from about 5.0% to about 35%, or 10% to 30% by weight of water. Water may be present in an amount defined by the following list of weight percents: 1, 5, 8, 10, 12, 15, 17, 20, 22, 25, 27, 30, 32, 35, 37, 40, 42, 45, 47 and 50. Still other preferred embodiments of the disclosed and claimed subject matter could include water in an amount to achieve the desired weight percent of the other ingredients.

Exemplary Embodiments of Etching Compositions

The following are exemplary embodiments of etching compositions that include (A) neat phosphoric acid and (B) a mixture of (I) a silicon-containing compound as disclosed herein and (II) an aqueous solvent.

In one embodiment, the etching composition includes:

A. approximately 70% or less by weight of neat phosphoric acid;

B. approximately 30% or greater by weight of a mixture comprising:

I. a compound of Formula I:

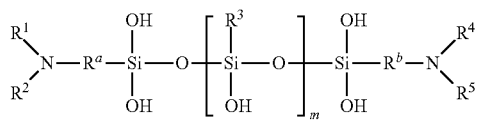

wherein:
(i) m=0-20,
(ii) each of $R^2$, $R^3$, $R^4$ and $R^5$ is independently selected from the group of hydrogen, a $C_1$ to $C_{10}$ linear alkyl group, a $C_1$ to $C_{10}$ linear alkyl group substituted with fluorine, a nitrogen-containing group, an oxygen-containing group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ⊦OH, and
(iii) each of $R^a$ and $R^b$ is independently selected from a $C_1$ to $C_{10}$ linear alkyl group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ⊦NH—$C_1$-$C_{10}$ alkyl, a $C_1$-$C_{10}$ alkyl substituted with ⊦OH; and II. an aqueous solvent.

In a further aspect of this embodiment, the etching composition consists essentially of A and B. In a further aspect of this embodiment, the etching composition consists of A and B.

In one embodiment, the etching composition includes:

A. approximately 70% or less by weight of neat phosphoric acid;

B. approximately 30% or greater by weight of a mixture comprising:

I. a compound of Formula II:

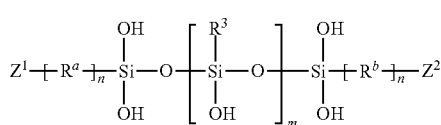

wherein:
(i) m=0-20,
(ii) n=0-20,
(iii) $R^3$ is selected from the group of hydrogen, a $C_1$ to $C_{10}$ linear alkyl group, a $C_1$ to $C_{10}$ linear alkyl group substituted with fluorine, a nitrogen-containing group, an oxygen-containing group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ⊦OH, $Z^1$ and $Z^2$, and (iv) each of $R^a$ and $R^b$ is independently selected from a $C_1$ to $C_{10}$ linear alkyl group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ⊦NH—$C_1$-$C_{10}$ alkyl, a $C_1$-$C_{10}$ alkyl substituted with ⊦OH, (v) $Z^1$ and $Z^2$ are each independently selected from:

a.

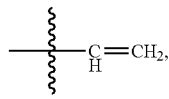

b.

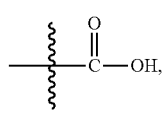

c. ⊦$N^+(CH_3)_3Cl^-$, and
d. ⊦$CH(OH)CH_2OH$; and

II. an aqueous solvent.

In a further aspect of this embodiment, the etching composition consists essentially of A and B. In a further aspect of this embodiment, the etching composition consists of A and B.

In one embodiment, the etching composition includes:

A. approximately 70% or less by weight of neat phosphoric acid;

B. approximately 30% or greater by weight of a mixture comprising:

I. a compound of Formula III:

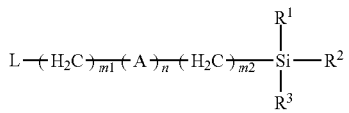

wherein:
(i) m1 and m2 each equal 0-10 provided and at least one of m1 and m2 is ≥1,
(ii) n=0 or 1,
(iii) each of $R^1$, $R^2$ and $R^3$ is independently selected from the group of hydrogen, a $C_1$ to $C_6$ linear alkyl group, a $C_3$ to $C_6$ branched alkyl group and a ⊦O—$C_1$ to $C_6$ linear alkyl group,
(iv) A is selected from:

a.

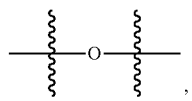 [SMILES: *O*]

b.

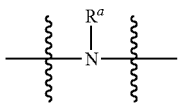

wherein $R^a$ is selected from hydrogen, a $C_1$ to $C_6$ linear alkyl group, a $C_3$ to $C_6$ branched alkyl group, c.

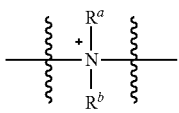

wherein $R^a$ and $R^b$ are each independently selected from hydrogen, a $C_1$ to $C_6$ linear alkyl group, a $C_3$ to $C_6$ branched alkyl group and d.

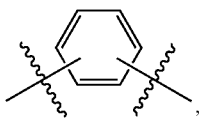, (v) L is selected from:

a.

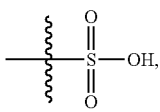 [SMILES: *S(=O)(=O)O]

b.

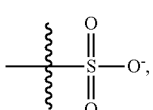

c.

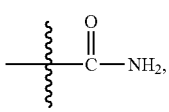

d.

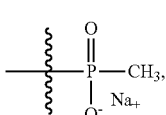

e.

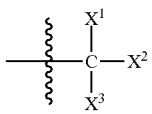

wherein each of $X^1$, $X^2$ and $X^3$ is independently selected from Cl, Br, F or I, f.

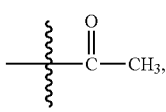

g.

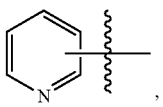, h.

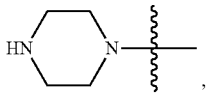, i.

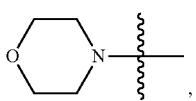, and j.

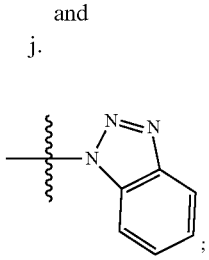;

and

II. an aqueous solvent.

In a further aspect of this embodiment, the etching composition consists essentially of A and B. In a further aspect of this embodiment, the etching composition consists of A and B.

In one embodiment, the etching composition includes:

A. greater than approximately 70% by weight of neat phosphoric acid;

B. less than approximately 30% by weight of a mixture comprising:

I. a compound of Formula I:

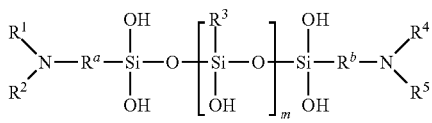

wherein:
 (i) M=0-20,
 (ii) each of $R^1$, $R^2$, $R^3$, $R^4$ and $R^5$ is independently selected from the group of hydrogen, a $C_1$ to $C_{10}$ linear alkyl group, a $C_1$ to $C_{10}$ linear alkyl group substituted with fluorine, a nitrogen-containing group, an oxygen-containing group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ─OH, and
 (iii) each of $R^a$ and $R^b$ is independently selected from a $C_1$ to $C_{10}$ linear alkyl group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ─NH─$C_1$-$C_{10}$ alkyl, a $C_1$-$C_{10}$ alkyl substituted with ─OH; and
II. an aqueous solvent.

In a further aspect of this embodiment, the etching composition consists essentially of A and B. In a further aspect of this embodiment, the etching composition consists of A and B. In a further aspect of this embodiment, the etching composition includes (i) greater than approximately 75% by weight of neat phosphoric acid and (ii) less than approximately 25% by weight of the mixture.

In one embodiment, the etching composition includes:
 A. greater than approximately 70% by weight of neat phosphoric acid;
 B. less than approximately 30% by weight of a mixture comprising:
  I. a compound of Formula II:

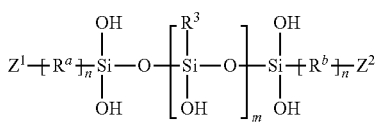

wherein:
 (i) m=0-20,
 (ii) n=0-20,
 (iii) $R^3$ is selected from the group of hydrogen, a $C_1$ to $C_{10}$ linear alkyl group, a $C_1$ to $C_{10}$ linear alkyl group substituted with fluorine, a nitrogen-containing group, an oxygen-containing group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ─OH, $Z^1$ and $Z^2$, and
 (iv) each of IV and $R^b$ is independently selected from a $C_1$ to $C_{10}$ linear alkyl group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ─NH─$C_1$-$C_{10}$ alkyl, a $C_1$-$C_{10}$ alkyl substituted with ─OH,
 (v) $Z^1$ and $Z^2$ are each independently selected from:
  a.

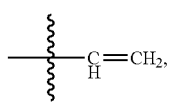

b.

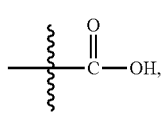

c. ─$N^+(CH_3)_3Cl^-$, and
  d. ─$CH(OH)CH_2OH$; and
II. an aqueous solvent.

In a further aspect of this embodiment, the etching composition consists essentially of A and B. In a further aspect of this embodiment, the etching composition consists of A and B. In a further aspect of this embodiment, the etching composition includes (i) greater than approximately 75% by weight of neat phosphoric acid and (ii) less than approximately 25% by weight of the mixture.

In one embodiment, the etching composition includes:
 A. greater than approximately 70% by weight of neat phosphoric acid;
 B. less than approximately 30% by weight of a mixture comprising:
  I. a compound of Formula III:

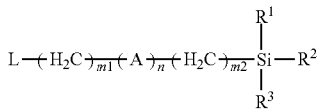

wherein:
 (i) m1 and m2 each equal 0-10 provided and at least one of m1 and m2 is ≥1,
 (ii) n=0 or 1,
 (iii) each of $R^1$, $R^2$ and $R^3$ is independently selected from the group of hydrogen, a $C_1$ to $C_6$ linear alkyl group, a $C_3$ to $C_6$ branched alkyl group and a ─O─$C_1$ to $C_6$ linear alkyl group,
 (iv) A is selected from:
  a.

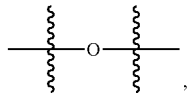 [SMILES: *O*]

b.

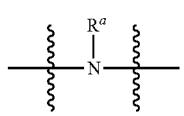

wherein $R^a$ is selected from hydrogen, a $C_1$ to $C_6$ linear alkyl group, a $C_3$ to $C_6$ branched alkyl group, c.

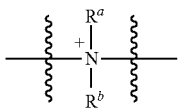

wherein $R^a$ and $R^b$ are each independently selected from hydrogen, a $C_1$ to $C_6$ linear alkyl group, a $C_3$ to $C_6$ branched alkyl group and d.

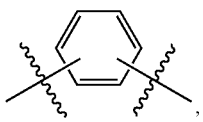, (v) L is selected from:

a.

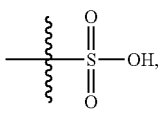 [SMILES: *S(=O)(=O)O], b.

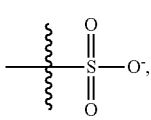, c.

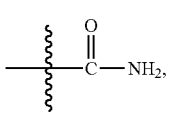 [SMILES: *C(N)=O], d.

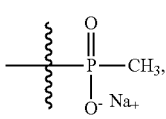, e.

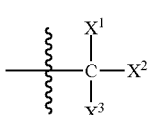

wherein each of $X^1$, $X^2$ and $X^3$ is independently selected from Cl, Br, F or I, f.

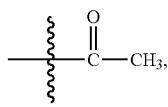, g.

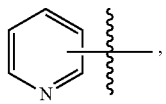, h.

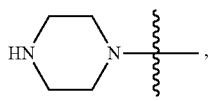, i.

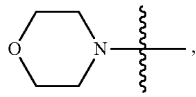, and j.

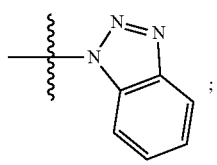 [SMILES: *n1nnc2ccccc21];

and

II. an aqueous solvent.

In a further aspect of this embodiment, the etching composition consists essentially of A and B. In a further aspect of this embodiment, the etching composition consists of A and B. In a further aspect of this embodiment, the etching composition includes (i) greater than approximately 75% by weight of neat phosphoric acid and (ii) less than approximately 25% by weight of the mixture.

C. Other Ingredients

The etching composition, including those exemplified above, can include other ingredients as described below.

I. Additional Acids

In some embodiments, the mixture further includes at least one additional acid other than phosphoric acid. In one aspect of this embodiment, the at least one additional is one of nitric acid ($HNO_3$), sulfuric acid ($H_2SO_4$), hydrochloric acid (HCl) and a sulfonic acid (e.g., methane sulfuric acid ($CH_3SO_3H$)).

a. Sulfuric Acid

In some embodiments, the at least one additional acid included in the mixture is sulfuric acid. In one aspect of this embodiment, the at least one additional acid includes approximately 25 wt % or less of neat sulfuric acid. In further aspect of this embodiment, the at least one additional acid consists of sulfuric acid. In some embodiments, the at least one additional acid consists of approximately 25 wt % or less of neat sulfuric acid.

In some embodiments of the etching compositions, the mixture includes neat sulfuric acid and the combined content of the neat phosphoric acid and the neat sulfuric acid is between approximately 80% and approximately 85% by weight of the composition. In a further aspect of this embodiment, the combined content of the neat phosphoric acid and the neat sulfuric acid is approximately 83.5% by weight of the composition.

In some embodiments of the etching compositions, the mixture further includes neat sulfuric acid and there is approximately 2.0 parts by weight to approximately 7.0 parts by weight of neat phosphoric acid per 1 part by weight of neat sulfuric acid. In a further aspect of this embodiment, there is approximately 2.0 parts by weight to approximately 6.0 parts by weight of neat phosphoric acid per 1 part by weight of neat sulfuric acid. In a further aspect of this embodiment, there is approximately 2.0 parts by weight to approximately 5.0 parts by weight of neat phosphoric acid per 1 part by weight of neat sulfuric acid. In a further aspect of this embodiment, there is approximately 2.0 parts by weight to approximately 4.0 parts by weight of neat phosphoric acid per 1 part by weight of neat sulfuric acid. In a further aspect of this embodiment, there is approximately 2.0 parts by weight to approximately 3.0 parts by weight of neat phosphoric acid per 1 part by weight of neat sulfuric acid. In a further aspect of this embodiment, there is approximately 2.0 parts by weight to approximately 2.5 parts by weight of neat phosphoric acid per 1 part by weight of neat sulfuric acid. In a further aspect of this embodiment, there is approximately 3.0 parts by weight of neat phosphoric acid per 1 part by weight of neat sulfuric acid. In a further aspect of this embodiment, there is approximately 2.25 parts by weight of neat phosphoric acid per 1 part by weight of neat sulfuric acid. In a further aspect of this embodiment, there is approximately 2.5 parts by weight of neat phosphoric acid per 1 part by weight of neat sulfuric acid. In a further aspect of this embodiment, there is approximately 2.75 parts by weight of neat phosphoric acid per 1 part by weight of neat sulfuric acid.

In some embodiments of the etching compositions, the mixture further includes neat sulfuric acid and the combined content of the neat phosphoric acid and the neat sulfuric acid is between approximately 80% and approximately 85% by weight of the composition. In a further aspect of this embodiment, the combined content of the neat phosphoric acid and the neat sulfuric acid is approximately 83.5% by weight of the composition.

Various non-limiting embodiments of the etching composition that include sulfuric acid are exemplified below.

i. Exemplary Embodiments: Compositions with a Silicon-Containing Compound of Formula I and Sulfuric Acid In some embodiments of the etching compositions, (i) the compound of Formula I is:

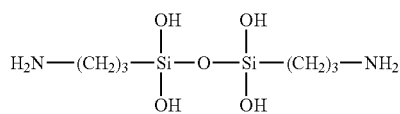

and (ii) the mixture further includes neat sulfuric acid.

In some embodiments of the etching compositions, (i) the compound of Formula I is:

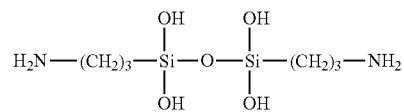

and (ii) the mixture further includes neat sulfuric acid where (iii) the combined content of the neat phosphoric acid and the neat sulfuric acid is between approximately 80% and approximately 85% by weight of the composition.

In some embodiments of the etching compositions, (i) the compound of Formula I is:

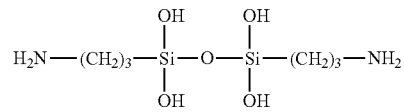

and (ii) the mixture further includes neat sulfuric acid where (iii) the combined content of the neat phosphoric acid and the neat sulfuric acid is approximately 83.5% by weight of the composition.

In some embodiments of the etching compositions, (i) the compound of Formula I is:

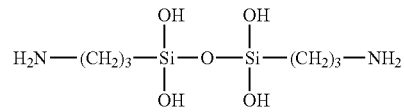

and (ii) the mixture further includes neat sulfuric acid where (iii) the combined content of the neat phosphoric acid and the neat sulfuric acid is approximately 83.83% by weight of the composition.

In some embodiments of the etching compositions, (i) the compound of Formula I is:

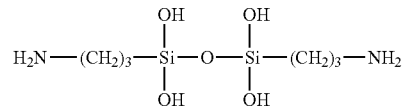

and (ii) the mixture further includes neat sulfuric acid where (iii) the combined content of the neat phosphoric acid and the neat sulfuric acid is approximately 83.94% by weight of the composition.

In some embodiments of the etching compositions, (i) the compound of Formula I is:

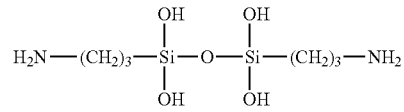

and (ii) the mixture further includes neat sulfuric acid where (iii) the combined content of the neat phosphoric acid and the neat sulfuric acid is approximately 84.27% by weight of the composition.

In some embodiments of the etching compositions, (i) the compound of Formula I is:

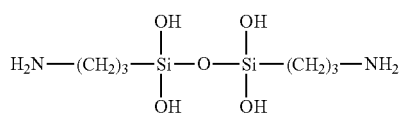

and (ii) the mixture further includes neat sulfuric acid where (iii) the combined content of the neat phosphoric acid and the neat sulfuric acid is approximately 84.6% by weight of the composition.

In some embodiments of the etching compositions, (i) the compound of Formula I is:

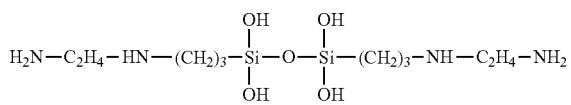

and (ii) the mixture further comprises neat sulfuric acid.

In some embodiments of the etching compositions, (i) the compound of Formula I is:

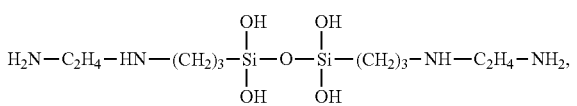

(ii) the mixture further comprises neat sulfuric acid and (iii) a combined content of the neat phosphoric acid and the neat sulfuric acid is between approximately 80% and approximately 85% by weight of the composition.

In some embodiments, the etching compositions, (i) the compound of Formula I is:

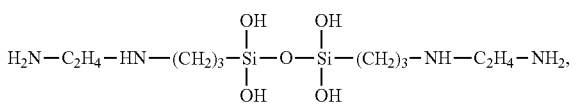

(ii) the mixture further comprises neat sulfuric acid and (iii) a combined content of the neat phosphoric acid and the neat sulfuric acid is approximately 83.5% by weight of the composition.

In some embodiments, the etching composition includes: A. approximately 60% or less by weight of neat phosphoric acid and B. approximately 40% or greater by weight of the mixture that includes: (i) approximately 5% or less by weight of:

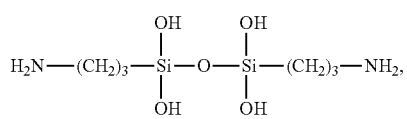

(ii) approximately 24% or less by weight of neat sulfuric acid and (iii) an aqueous solvent comprising water.

In some embodiments, the etching composition consists essentially of: A. approximately 60% or less by weight of neat phosphoric acid and B. approximately 40% or greater by weight of the mixture that includes: (i) approximately 5% or less by weight of:

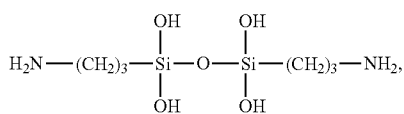

(ii) approximately 24% or less by weight of neat sulfuric acid; and (iii) an aqueous solvent consisting essentially of water.

In some embodiments, the etching composition consists of: A. approximately 60% or less by weight of neat phosphoric acid and B. approximately 40% or greater by weight of a mixture consisting of: (i) approximately 5% or less by weight of:

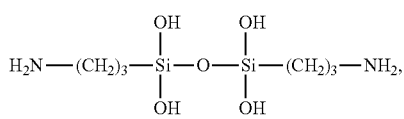

(ii) approximately 24% or less by weight of neat sulfuric acid and (iii) an aqueous solvent consisting of water.

ii. Exemplary Embodiments: Compositions with a Silicon-Containing Compound of Formula II and Sulfuric Acid In some embodiments of the etching compositions, (i) the compound of Formula is:

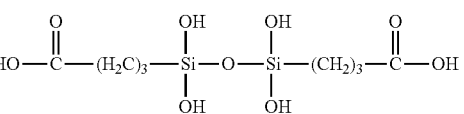

and (ii) the mixture further comprises neat sulfuric acid.

In some embodiments of the etching compositions, (i) the compound of Formula II is:

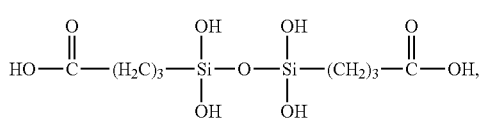

(ii) the mixture further includes neat sulfuric acid and (iii) the combined content of the neat phosphoric acid and the neat sulfuric acid is between approximately 80% and approximately 85% by weight of the composition.

In some embodiments of the etching compositions, (i) the compound of Formula II is:

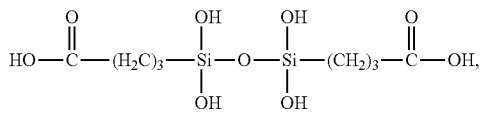

(ii) the mixture further includes sulfuric acid and (iii) the combined content of the neat phosphoric acid and the neat sulfuric acid is approximately 83.5% by weight of the composition.

In some embodiments of the etching compositions, (i) the compound of Formula II is:

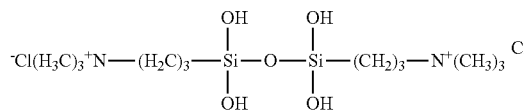

and (ii) the mixture further includes neat sulfuric acid.

In some embodiments of the etching compositions, (i) the compound of Formula II is:

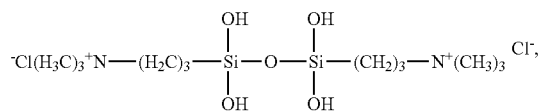

(ii) the mixture further includes neat sulfuric acid and (iii) the combined content of the neat phosphoric acid and the neat sulfuric acid is between approximately 80% and approximately 85% by weight of the composition.

In some embodiments of the etching compositions, (i) the compound of Formula II is:

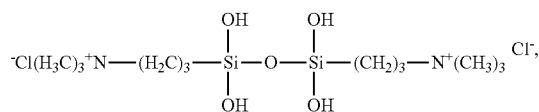

(ii) the mixture further includes sulfuric acid and (iii) a combined content of the neat phosphoric acid and the neat sulfuric acid is approximately 83.5% by weight of the composition.

iii. Exemplary Embodiments: Compositions with a Silicon-Containing Compound of Formula III and Sulfuric Acid In some embodiments of the etching compositions, (i) the compound of Formula III is:

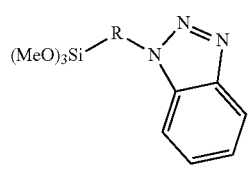

where $R=-(CH_2)_x-$ and x=1-5 and (ii) the mixture further includes neat sulfuric acid. In a further aspect of this embodiment, x=1. In a further aspect of this embodiment, x=2. In a further aspect of this embodiment, x=3. In a further aspect of this embodiment, x=4. In a further aspect of this embodiment, x=5.

In some embodiments of the etching compositions, (i) the compound of Formula III is:

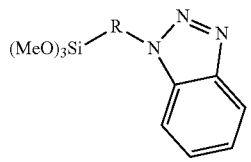

where $R=-(CH_2)_x-$ and x=1-5, (ii) the mixture further includes neat sulfuric acid and (iii) a combined content of the neat phosphoric acid and the neat sulfuric acid is between approximately 80% and approximately 85% by weight of the composition. In a further aspect of this embodiment, x=1. In a further aspect of this embodiment, x=2. In a further aspect of this embodiment, x=3. In a further aspect of this embodiment, x=4. In a further aspect of this embodiment, x=5.

In some embodiments of the etching compositions, (i) the compound of Formula III is:

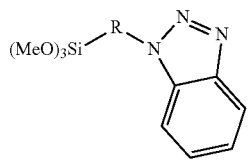

where $R=-(CH_2)_x-$ and x=1-5, (ii) the mixture further includes sulfuric acid and (iii) the combined content of the neat phosphoric acid and the neat sulfuric acid is approximately 83.5% by weight of the composition. In a further aspect of this embodiment, x=1. In a further aspect of this embodiment, x=2. In a further aspect of this embodiment, x=3. In a further aspect of this embodiment, x=4. In a further aspect of this embodiment, x=5.

In some embodiments of the etching compositions, (i) the compound of Formula III is $Si(OCH_3)_3(CH_2CH_2CF_3)$ and (ii) the mixture further includes neat sulfuric acid.

In some embodiments of the etching compositions, (i) the compound of Formula III is $Si(OCH_3)_3(CH_2CH_2CF_3)$, (ii) the mixture further includes neat sulfuric acid and (iii) a combined content of the neat phosphoric acid and the neat sulfuric acid is between approximately 80% and approximately 85% by weight of the composition.

In some embodiments of the etching compositions, (i) the compound of Formula III is $Si(OCH_3)_3(CH_2CH_2CF_3)$, (ii) the mixture further includes sulfuric acid and (iii) the combined content of the neat phosphoric acid and the neat sulfuric acid is approximately 83.5% by weight of the composition.

In some embodiments of the etching compositions, (i) the compound of Formula III is:

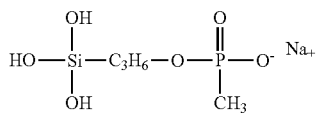

and (ii) the mixture further includes neat sulfuric acid.

In some embodiments of the etching compositions, (i) the compound of Formula III is:

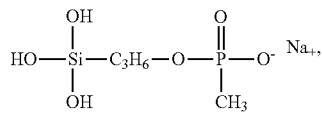

(ii) the mixture further includes neat sulfuric acid and (iii) a combined content of the neat phosphoric acid and the neat sulfuric acid is between approximately 80% and approximately 85% by weight of the composition.

In some embodiments of the etching compositions, (i) the compound of Formula III is:

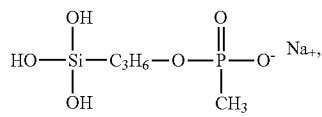

(ii) the mixture further includes sulfuric acid and (iii) a combined content of the neat phosphoric acid and the neat sulfuric acid is approximately 83.5% by weight of the composition.

In some embodiments of the etching compositions, (i) the compound of Formula III is:

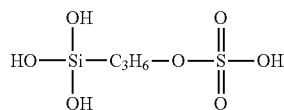

and (ii) the mixture further includes neat sulfuric acid.

In some embodiments of the etching compositions, (i) the compound of Formula III is: (ii) the mixture further includes neat sulfuric acid and (iii) a combined content of the neat phosphoric acid and the neat sulfuric acid is between approximately 80% and approximately 85% by weight of the composition.

In some embodiments of the etching compositions, (i) the compound of Formula III is:

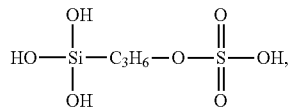

(ii) the mixture further includes neat sulfuric acid and (iii) a combined content of the neat phosphoric acid and the neat sulfuric acid is between approximately 83.5% by weight of the composition.

In some embodiments of the etching compositions, (i) the compound of Formula III is:

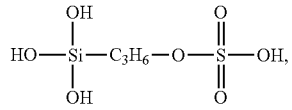

and (ii) the mixture further includes neat sulfuric acid.

In some embodiments of the etching compositions, (i) the compound of Formula III is:

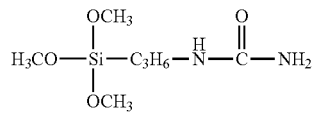

and (ii) the mixture further includes neat sulfuric acid.

In some embodiments of the etching compositions, (i) the compound of Formula III is:

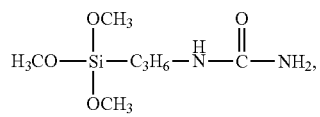

(ii) the mixture further includes neat sulfuric acid and (iii) the combined content of the neat phosphoric acid and the neat sulfuric acid is between approximately 80% and approximately 85% by weight of the composition.

In some embodiments of the etching compositions, (i) the compound of Formula III is:

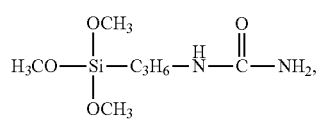

(ii) the mixture further includes sulfuric acid and (iii) the combined content of the neat phosphoric acid and the neat sulfuric acid is approximately 83.5% by weight of the composition.

b. Sulfonic Acids

In some embodiments, the at least one additional acid included in the mixture is a sulfonic acid. The sulfonic acid is typically an alkyl or aryl sulfonic acid. Sulfonic acid has the following general structure R'—S(O)(O)—OH. In one aspect of this embodiment, R' is selected from a C1 to C10 linear alkyl group, a C3 to C10 branched alkyl group, a C3 to C10 cyclic alkyl group, a C5 to C12 aryl group, a C2 to C10 linear or branched alkenyl group, a C2 to C10 linear or branched alkynyl group. In another aspect of this embodiment, R' is selected from a C1 to C10 linear alkyl group or a C3 to C10 branched alkyl group. In another aspect, the mixture includes one or more sulfonic acids selected from ethanesulfonic acid, 3-hydroxypropane-1-sulfonic acid, 3-amino-1-propanesulfonic acid, sulfoacetic acid, nonafluorobutane-1-sulfonic acid, benzenesulfonic acid, 3-aminobenzenesulfonic acid, p-toluenesulfonic acid monohydrate and methane sulfonic acid. In one aspect of this embodiment, the sulfonic acid is methane sulfuric acid ($CH_3SO_3H$).

c. Other Acids

In some embodiments, the at least one additional acid included in the mixture is sulfuric acid is one or more of nitric acid ($HNO_3$) and hydrochloric acid (HCl).

The total amount of the at least one additional acid (such as a sulfonic acid and/or sulfuric acid) is from about 0.1% to about 60%, about 0.2% to about 40% or about 0.5% to about 35% by weight of the etching composition. Preferably, when employed, the at least one additional acid includes from about 1% to about 30% by weight of the composition. In alternative embodiments the total amount the at least one additional acid is an amount within a range with start and endpoints defined by the following list of weight percents 0.1, 0.5, 0.8, 1, 2, 3, 4, 5, 6, 7.0, 8, 9, 10, 11, 12, 13, 14, 15, 16, 17, 18, 19, 20, 21, 22, 23, 24, 25, 27, 30, 32, 35, 37 and 40. These weight percentages are "neat" weight percent values.

In alternative embodiments, the composition of the disclosed and claimed subject matter will be free of or substantially free of the at least one additional acid (such as added sulfuric acid and/or sulfonic acid).

II. Additional Silicon-Containing Compound

In some embodiments, the mixture can include an additional silicon-containing compound(s) other than those of Formula 1, Formula II or Formula III. Such additional silicon-containing compound(s) can be is one or more of alkylsilsesquioxanes, vinylsilsesquioxane, carboxylic acid alkylsilsesquioxane and alkyleneglycol alkylsilsesquioxane III. Hydroxyl Group-Containing Water-Miscible Solvent In some embodiments, the mixture can include a hydroxyl group-containing water-miscible solvent. The hydroxyl group-containing water-miscible solvent functions primarily to protect the silicon oxide such that the silicon nitride is etched preferentially and selectively.

Classes of suitable hydroxyl group-containing water-miscible solvents include, but are not limited to, alkane diols and polyols (including, but not limited to, alkylene glycols), glycols, alkoxyalcohols (including but not limited to glycol monoethers), saturated aliphatic monohydric alcohols, unsaturated non-aromatic monohydric alcohols, and low molecular weight alcohols containing a ring structure.

Examples of suitable water soluble alkane diols and polyols such as ($C_2$-$C_{20}$) alkanediols and ($C_3$-$C_{20}$) alkanetriols including, but not limited to, 2-methyl-1,3-propanediol, 1,3-propanediol, 2,2-dimethyl-1,3-propanediol, 1,4-butanediol, 1,3-butanediol, 1,2-butanediol, 2,3-butanediol, and pinacol.

Examples of suitable water soluble alkylene glycols include, but are not limited to, ethylene glycol, propylene glycol, diethylene glycol, glycerol, dipropylene glycol, triethylene glycol and tetraethyleneglycol.

Examples of suitable water soluble alkoxyalcohols include, but are not limited to, 3-methoxy-3-methyl-1-butanol, 3-methoxy-1-butanol, 1-methoxy-2-butanol, and water soluble glycol monoethers.

Examples of suitable water soluble glycol monoethers include, but are not limited to, ethylene glycol monomethyl ether, ethylene glycol monoethyl ether, ethylene glycol mono n-propyl ether, ethylene glycol monoisopropyl ether, ethylene glycol mono n-butyl ether, diethylene glycol monomethyl ether, diethylene glycol monoethyl ether, diethylene glycol monobutylether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol mono-n-propyl ether, tripropylene glycol monoethyl ether, tripropylene glycol monomethyl ether and ethylene glycol monobenzyl ether, diethylene glycol monobenzyl ether, and mixtures thereof.

Examples of suitable water soluble saturated aliphatic monohydric alcohols include, but are not limited to methanol, ethanol, n-propyl alcohol, isopropyl alcohol, 1-butanol, 2-butanol, isobutyl alcohol, tert-butyl alcohol, 2-pentanol, t-pentyl alcohol, 1-hexanol, and mixtures thereof.

Examples of suitable water soluble unsaturated non-aromatic monohydric alcohols include, but are not limited to allyl alcohol, propargyl alcohol, 2-butenyl alcohol, 3-butenyl alcohol, 4-penten-2-ol, and mixtures thereof.

Examples of suitable water soluble, low molecular weight alcohols containing a ring structure include, but are not limited to, alpha-terpineol, tetrahydrofurfuryl alcohol, furfuryl alcohol, 1,3-cyclopentanediol, and mixtures thereof.

In some embodiments, the amount of hydroxyl group-containing water-miscible solvent constitutes from about 1.0% to about 30% by weight of the composition. Preferably, when employed, the hydroxyl group-containing water-miscible solvent constitutes from about 5% to about 15% by weight of the composition.

In some embodiments, the compositions of the disclosed and claimed subject matter will be free or substantially free of hydroxyl group-containing water-miscible solvent or any or all of the hydroxyl group-containing water-miscible solvents listed above.

IV. Silicic Acid

In some embodiments, the mixture can include a silicic acid. If employed, the silicic acid aids in protecting the silicon oxide and increasing the selectivity of the silicon nitride etch.

In some embodiments, the amount of silicic acid will constitute from about 0.001% to about 5.0% by weight of the composition and, preferably, from about 0.01% by weight to about 2.0% by weight. In other embodiments, the silicic acid constitutes from about 0.02% to about 0.08% by weight of the composition.

In some embodiments, the compositions of the disclosed and claimed subject matter will be free of or substantially free of added silicic acid.

V. Phosphate Compound

In some embodiments, the mixture can include a phosphate compound such as, for example, triethyl phosphate (TEPO) and/or trimethyl phosphate (TMPO). If employed, the phosphate compound functions as a supplemental solvent.

In some embodiments, the amount of the phosphate compound (e.g., TMPO) will constitute from about 0.05% to about 15% by weight of the composition and, preferably, from about 0.1% by weight to about 5% by weight. In other embodiments, when employed, the phosphate compound (e.g., TMPO) constitutes about 2% by weight of the composition.

In some embodiments, the compositions of the disclosed and claimed subject matter will be free of or substantially free of added phosphate compounds.

VI. Surfactants

In some embodiments, the mixture can include at least one water-soluble nonionic surfactant. Surfactants serve to aid in the removal of residue.

Examples of the water-soluble nonionic surfactants include polyoxyethylene lauryl ether, polyoxyethylene cetyl ether, polyoxyethylene steary ether, polyoxyethylene oleyl ether, polyoxyethylene higher alcohol ether, polyoxyethylene octyl phenyl ether, polyoxyethylene nonyl phenyl ether, polyoxyethylene derivatives, polyoxyethylene sorbitan monolaurate, polyoxyethylene sorbitan monopalmitate, polyoxyethylene sorbitan monostearate, polyoxyethylene sorbitan tristearate, polyoxyethylene sorbitan monooleate, polyoxyethylene sorbitan trioleate, polyoxyethylene sorbit tetraoleate, polyethylene glycol monolaurate, polyethylene glycol monostearate, polyethylene glycol distearate, polyethylene glycol monooleate, polyoxyethylene alkylamine, polyoxyethylene hardened castor oil, alkylalkanolamide and mixtures thereof.

In some embodiments, the amount of the surfactant will include from about 0.001 wt. % to about 5 wt. % of the composition, preferably from about 0.01 wt. % to about 2.5 wt. % and, most preferably, from about 0.1 wt. % to about 1.0 wt. % of the composition.

In some embodiments, the compositions of the disclosed and claimed subject matter will be free of or substantially free of surfactants.

VII. Chelating Agents

In some embodiments, the mixture can include at least one metal chelating agents. Metal chelating agents can function to increase the capacity of the composition to retain metals in composition and to enhance the dissolution of metallic residues.

Examples of suitable chelating agents, include, but are not limited to, the following organic acids and their isomers and salts: ethylenediaminetetraacetic acid (EDTA), butylenediaminetetraacetic acid, (1,2-cyclohexylenediamine)tetraacetic acid (CyDTA), diethylenetriaminepentaacetic acid (DETPA), ethylenediaminetetrapropionic acid, (hydroxyethyl)ethylenediaminetriacetic acid (HEDTA), N,N,N',N'-ethylenediaminetetra(methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, nitrotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, propyl gallate, pyrogallol, 8-hydroxyquinoline, and cysteine. Preferred chelating agents are aminocarboxylic acids such as EDTA, CyDTA and aminophosphonic acids such as EDTMP.

In some embodiments, the amount of the chelating agent will constitute from about 0.1 wt. % to about 10 wt. %, and preferably from about 0.5 wt. % to about 5 wt. %, of the composition.

In some embodiments, the compositions of the disclosed and claimed subject matter will be free of or substantially free of chelating agents.

In some embodiment, the compositions are substantially free or free of metal hydroxides, added metals, halide containing compounds, TEOS, silyl phosphate compounds and silanes and silanols that do not include repeating monomers.

Methods of Manufacture

The disclosed and claimed subject matter further includes method of manufacturing the etching compositions described and claimed herein.

In one embodiment, the method for forming the etching composition includes combining: A. approximately 70% or less by weight of neat phosphoric acid; and
B. approximately 30% or greater by weight of a mixture comprising:
I. a compound of Formula I:

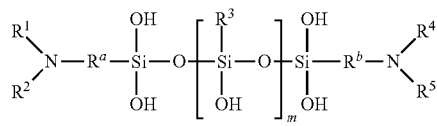

wherein:
(i) m=0-20,
(ii) each of $R^1$, $R^2$, $R^3$, $R^4$ and $R^5$ is independently selected from the group of hydrogen, a $C_1$ to $C_{10}$ linear alkyl group, a $C_1$ to $C_{10}$ linear alkyl group substituted with fluorine, a nitrogen-containing group, an oxygen-containing group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ꜩOH, and
(iii) each of $R^a$ and $R^b$ is independently selected from a $C_1$ to $C_{10}$ linear alkyl group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ꜩNH—$C_1$-$C_{10}$ alkyl, a $C_1$-$C_{10}$ alkyl substituted with ꜩOH; and
II. an aqueous solvent.

In one embodiment, the method for forming the etching composition includes combining: A. approximately 70% or less by weight of neat phosphoric acid;
B. approximately 30% or greater by weight of a mixture comprising:
I. a compound of Formula II:

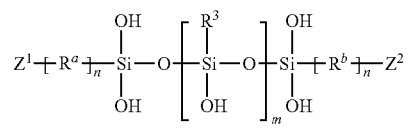

wherein:
(i) m=0-20,
(ii) n=0-20,
(iii) $R^3$ is selected from the group of hydrogen, a $C_1$ to $C_{10}$ linear alkyl group, a $C_1$ to $C_{10}$ linear alkyl group substituted with fluorine, a nitrogen-containing group, an oxygen-containing group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ꜩOH, $Z^1$ and $Z^2$, and
(iv) each of $R^a$ and $R^b$ is independently selected from a $C_1$ to $C_{10}$ linear alkyl group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ꜩNH—$C_1$-$C_{10}$ alkyl, a $C_1$-$C_{10}$ alkyl substituted with ꜩOH,
(v) $Z^1$ and $Z^2$ are each independently selected from:
a.

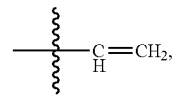

b.

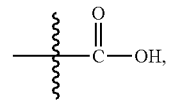 [SMILES: *C(=O)O]

c. ꜩ$N^+(CH_3)_3Cl^-$, and
d. ꜩ$CH(OH)CH_2OH$; and
II. an aqueous solvent.

In one embodiment, the method for forming the etching composition includes combining: A. approximately 70% or less by weight of neat phosphoric acid;

B. approximately 30% or greater by weight of a mixture comprising:

I. a compound of Formula III:

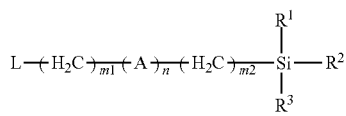

wherein:
- (i) m1 and m2 each equal 0-10 provided and at least one of m1 and m2 is ≥1,
- (ii) n=0 or 1,
- (iii) each of $R^1$, $R^2$ and $R^3$ is independently selected from the group of hydrogen, a $C_1$ to $C_6$ linear alkyl group, a $C_3$ to $C_6$ branched alkyl group and a ─O─$C_1$ to $C_6$ linear alkyl group,
- (iv) A is selected from:
  - a.

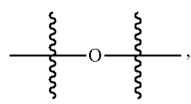

- b.

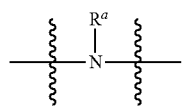

wherein $R^a$ is selected from hydrogen, a $C_1$ to $C_6$ linear alkyl group, a $C_3$ to $C_6$ branched alkyl group,
  - c.

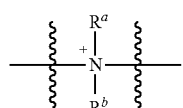

wherein $R^a$ and $R^b$ are each independently selected from hydrogen, a $C_1$ to $C_6$ linear alkyl group, a $C_3$ to $C_6$ branched alkyl group, and
  - d.

- (v) L is selected from:
  - a.

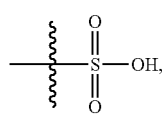 [SMILES: *S(=O)(=O)O]

- b.

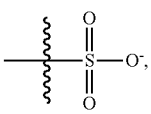

- c.

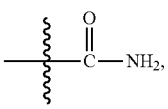

- d.

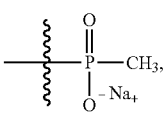 [SMILES: *P(C)(=O)O ; [Na+]]

- e.

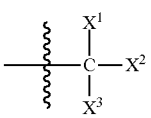

wherein each of $X^1$, $X^2$ and $X^3$ is independently selected from Cl, Br, F or I,
  - f.

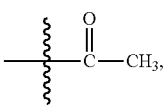

- g.

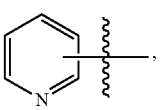

- h.

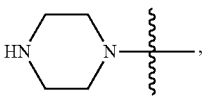

i.

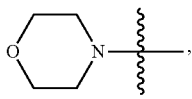

and j.

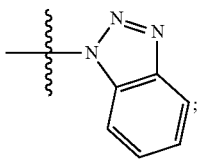

and

II. an aqueous solvent.

In one embodiment, the method for forming the etching composition includes combining: A. greater than approximately 70% by weight of neat phosphoric acid; B. less than approximately 30% by weight of a mixture comprising:

I. a compound of Formula I:

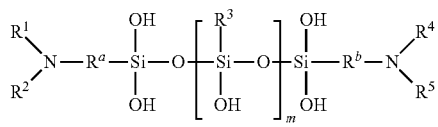

wherein:
(i) M=0-20,
(ii) each of $R^1$, $R^2$, $R^3$, $R^4$ and $R^5$ is independently selected from the group of hydrogen, a $C_1$ to $C_{10}$ linear alkyl group, a $C_1$ to $C_{10}$ linear alkyl group substituted with fluorine, a nitrogen-containing group, an oxygen-containing group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ─OH, and
(iii) each of $R^a$ and $R^b$ is independently selected from a $C_1$ to $C_{10}$ linear alkyl group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ─NH─$C_1$-$C_{10}$ alkyl, a $C_1$-$C_{10}$ alkyl substituted with ─OH; and II. an aqueous solvent.

In one embodiment, the method for forming the etching composition includes combining: A. greater than approximately 70% by weight of neat phosphoric acid; B. less than approximately 30% by weight of a mixture comprising:

I. a compound of Formula II:

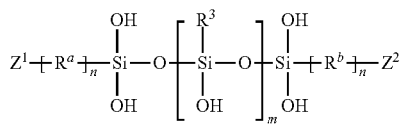

wherein:
(i) m=0-20,
(ii) n=0-20,
(iii) $R^3$ is selected from the group of hydrogen, a $C_1$ to $C_{10}$ linear alkyl group, a $C_1$ to $C_{10}$ linear alkyl group substituted with fluorine, a nitrogen-containing group, an oxygen-containing group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ─OH, $Z^1$ and $Z^2$, and
(iv) each of $R^a$ and $R^b$ is independently selected from a $C_1$ to $C_{10}$ linear alkyl group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ─NH─$C_1$-$C_{10}$ alkyl, a $C_1$-$C_{10}$ alkyl substituted with ─OH,
(v) $Z^1$ and $Z^2$ are each independently selected from:

a.

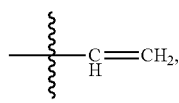

b.

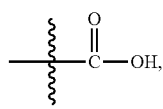

c. ─$N^+(CH_3)_3Cl^-$, and
d. ─$CH(OH)CH_2OH$; and

II. an aqueous solvent.

In one embodiment, the method for forming the etching composition includes combining: A. greater than approximately 70% by weight of neat phosphoric acid; B. less than approximately 30% by weight of a mixture comprising:

I. a compound of Formula III:

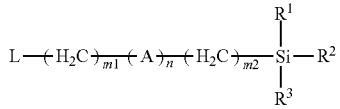

wherein:
(i) m1 and m2 each equal 0-10 provided and at least one of m1 and m2 is ≥1,
(ii) n=0 or 1,
(iii) each of $R^1$, $R^2$ and $R^3$ is independently selected from the group of hydrogen, a $C_1$ to $C_6$ linear alkyl group, a $C_3$ to $C_6$ branched alkyl group and a ─O─$C_1$ to $C_6$ linear alkyl group,
(iv) A is selected from:

a.

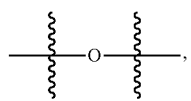

b. wherein

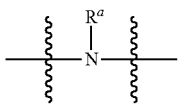

is selected from hydrogen, a $C_1$ to $C_6$ linear alkyl group, a $C_3$ to $C_6$ branched alkyl group, c. wherein

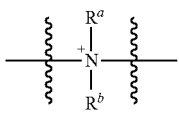

$R^a$ and $R^b$ are each independently selected from hydrogen, a $C_1$ to $C_6$ linear alkyl group, a $C_3$ to $C_6$ branched alkyl group and d.

(v) L is selected from:

a.

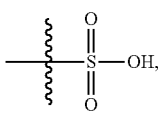 [SMILES: *S(=O)(=O)O]

b.

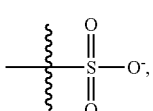

c.

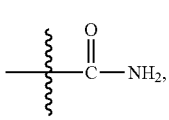 [SMILES: *C(N)=O]

d.

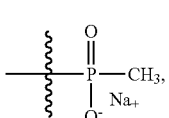

e.

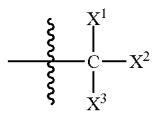

wherein each of $X^1$, $X^2$ and $X^3$ is independently selected from Cl, Br, F or I, f.

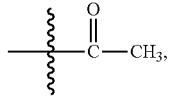 [SMILES: *C(C)=O]

g.

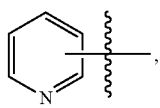

h.

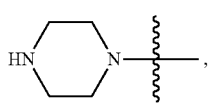

i.

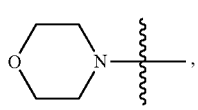 [SMILES: *N1CCOCC1]

and j.

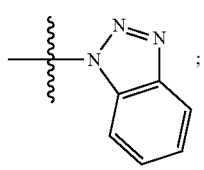 [SMILES: *n1nnc2ccccc21]

and

II. an aqueous solvent.

Methods of Use

The disclosed and claimed subject matter further includes a method of selectively enhancing the etch rate of silicon nitride relative to silicon dioxide on a composite semiconductor device comprising silicon nitride and silicon dioxide.

In one embodiment, the method includes the steps of:

a. contacting the composite semiconductor device including silicon nitride and silicon dioxide with one or more of the etching compositions disclosed and/or claimed herein, and b. rinsing the composite semiconductor device after the silicon nitride is at least partially removed.

In as further aspect of this embodiment, the contacting step is performed at a temperature of about 160° C.

In a further embodiment, the method can include c. a drying step.

In the described methods, "at least partially removed" means removal of at least 90% of the material, preferably at least 95% removal. Most preferably, at least 99% removal using the compositions of the present development.

In a further embodiment, the method can include a pre-treatment step which includes contacting (e.g., by dipping or spraying) the substrate with dilute hydrofluoric acid (dHF) (1:100 HF:water). It has been observed that a dHF pretreatment step could be eliminated and high relative etch rates could still be achieved using the compositions of this disclosed and claimed subject matter. Additionally, it was determined that the compositions of the disclosed and claimed subject matter, as compared to a phosphoric acid composition alone, provided less damage to the substrates when the pretreatment dHF step was used. Further damage due to the dHF pretreatment step could be minimized by decreased agitation when treating with the compositions of the disclosed and claimed subject matter and decreased time between pretreatment and contact with the compositions of the disclosed and claimed subject matter.

In some embodiments, the contacting step can be carried out by any suitable means such as, for example, immersion, spray, or via a single wafer process.

In some embodiments, the temperature of the composition during the contacting step is preferably from about 100° C. to 200° C. In a further aspect, the temperature is about 140° C. to 180° C. In a further aspect, the temperature of the composition during the contacting step is about 160° C.

In some embodiments, the etch selectivity of silicon nitride over silicon oxide of the disclosed and claimed subject etch compositions is over from about 300. In a further aspect, the etch selectivity of silicon nitride over silicon oxide of the disclosed and claimed subject etch compositions is over from about 500. In a further aspect, the etch selectivity of silicon nitride over silicon oxide of the disclosed and claimed subject etch compositions is over from about 1000. In a further aspect, the etch selectivity of silicon nitride over silicon oxide of the disclosed and claimed subject etch compositions is over from about 1250. In a further aspect, the etch selectivity of silicon nitride over silicon oxide of the disclosed and claimed subject etch compositions is over from about 1500. In a further aspect, the etch selectivity of silicon nitride over silicon oxide of the disclosed and claimed subject etch compositions is over from about 2000. In a further aspect, the etch selectivity of silicon nitride over silicon oxide of the disclosed and claimed subject etch compositions is over from about 2500. In a further aspect, the etch selectivity of silicon nitride over silicon oxide of the disclosed and claimed subject etch compositions is over from about 3000. In a further aspect, the etch selectivity of silicon nitride over silicon oxide of the disclosed and claimed subject etch compositions is over from about 3500. In a further aspect, the etch selectivity of silicon nitride over silicon oxide of the disclosed and claimed subject etch compositions is over from about 4000. In a further aspect, the etch selectivity of silicon nitride over silicon oxide of the disclosed and claimed subject etch compositions is over from about 4500. In a further aspect, the etch selectivity of silicon nitride over silicon oxide of the disclosed and claimed subject etch compositions is over from about 5000.

In some embodiments, the silicon oxide etch is less than 1 Å/min. In a further aspect the silicon oxide etch is less than 0.5 Å/min. In a further aspect, the silicon oxide etch is less than 0.01 Å/min.

In some embodiments, the rinsing step c. is carried out by any suitable means, for example, rinsing the substrate with de-ionized water by immersion or spray techniques. In another aspect, the rinsing step is carried out employing a mixture of de-ionized water and a water-miscible organic solvent such as, for example, isopropyl alcohol.

In some embodiments, the drying step is carried out by any suitable means, for example, isopropyl alcohol (IPA) vapor drying, heat, or by centripetal force.

EXAMPLES

Reference will now be made to more specific embodiments of the present disclosure and experimental results that provide support for such embodiments. The examples are given below to more fully illustrate the disclosed subject matter and should not be construed as limiting the disclosed subject matter in any way.

It will be apparent to those skilled in the art that various modifications and variations can be made in the disclosed subject matter and specific examples provided herein without departing from the spirit or scope of the disclosed subject matter. Thus, it is intended that the disclosed subject matter, including the descriptions provided by the following examples, covers the modifications and variations of the disclosed subject matter that come within the scope of any claims and their equivalents.

Materials and Methods

All ingredients used herein are commercially available.

In the Examples, the following silicon-containing compounds were used:

| Ref. | Silicon-Containing Compound | CAS No. |
|---|---|---|
| Si Compound 1 | $H_2N-(CH_2)_3-\underset{OH}{\overset{OH}{Si}}-O-\underset{OH}{\overset{OH}{Si}}-(CH_2)_3-NH_2$ | — |
| Si Compound 2 | $HO-\overset{O}{\underset{}{C}}-(H_2C)_3-\underset{OH}{\overset{OH}{Si}}-O-\underset{OH}{\overset{OH}{Si}}-(CH_2)_3-\overset{O}{\underset{}{C}}-OH$ | — |

| Ref. | Silicon-Containing Compound | CAS No. |
|---|---|---|
| Si Compound 3 | Trimethoxy(3,3,3-trifluoropropyl)silane | 429-60-7 |
| Si Compound 4 | $^-Cl(H_3C)_3{}^+N\!-\!(H_2C)_3\!-\!Si(OH)_2\!-\!O\!-\!Si(OH)_2\!-\!(CH_2)_3\!-\!N^+(CH_3)_3 \; Cl^-$ | — |
| Si Compound 5 | $(MeO)_3Si\!-\!R\!-\!$ benzotriazolyl; where $R = -(CH_2)_x-$ and $x = 1\text{-}5$ | — |
| Si Compound 6 | 1-[3-(Trimethoxysilyl)propyl]urea | 23843-64-3 |
| Si Compound 7 | 3-(Trihydroxysilyl)propane-1-sulfonic acid | 70942-24-4 |
| Si Compound 8 | 3-(Trihydroxysilyl)propyl methylphosphonate, monosodium salt composition | 84962-98-1 |
| Si Compound 9 | $H_2N\!-\!C_2H_4\!-\!HN\!-\!(CH_2)_3\!-\!Si(OH)_2\!-\!O\!-\!Si(OH)_2\!-\!(CH_2)_3\!-\!NH\!-\!C_2H_4\!-\!NH_2$ | — |

General Procedure for Preparing the Etching Compositions

All compositions set forth in the Examples were prepared by mixing the components in a 250 mL beaker with a 1" Teflon-coated stir bar. Typically, the first material added to the beaker was deionized (DI) water. Phosphoric acid is typically added next followed by the silicon-containing compound and then the remaining components (if any).

Compositions of the Substrate

Each test 20 mm×20 mm coupon employed in the examples included a layer of silicon nitride, $SiN_x$, on a silicon substrate. Comparative examples included a layer of silicon oxide, $SiO_x$, on a silicon substrate.

Processing Conditions

Etching tests were run using 100 g of the etching compositions in a 250 mL beaker with a ½" round Teflon stir bar set at 300 rpm. The etching compositions were heated to a temperature of about 160° C. on a hot plate. The $SiN_x$, polysilicon and pattern test substrate pieces (test coupons) were treated with DHF (1:100 HF:DI water) for about 3 minutes prior to testing. the $SiO_x$ test coupons were not pretreated with DHF. The test coupons were immersed in the compositions for about 3 (for $SiN_x$ substrates) to about 60 (for SiOx substrates) minutes while stirring.

The segments were then rinsed for about 3 minutes in a DI water bath or spray and subsequently dried using filtered nitrogen. The silicon nitride and silicon oxide etch rates were estimated from changes in the thickness before and after etching and was measured by spectroscopic ellipsometry (FilmTek™ 2000 PAR-SE, Scientific Computing International). Typical starting layer thickness was 4395 Å for $SiN_x$ and 229 Å for $SiO_x$.

The following series of Tables show the evaluation results of several embodiments of the disclosed and claimed etching compositions.

TABLE 1

Effect of Si Compounds on Selectivity of SiNx Over $SiO_2$ in the Presence of $H_2SO_4$

| Raw Material | Assay, wt % | Ex. 1 | Ex. 2 | Ex. 3 | Ex. 3 | Ex. 4 | Ex. 5 | Ex. 6 | Ex. 7 | Ex. 8 |
|---|---|---|---|---|---|---|---|---|---|---|
| $H_3PO_4$ | 85 | 70.00 | 70.00 | 70.00 | 70.00 | 70.00 | 70.00 | 70.00 | 70.00 | 70.00 |
| DIW | 100 | — | — | 3.50 | — | 3.50 | 3.50 | — | 1.43 | — |
| Si Compound 1 | 30 | 5.00 | — | — | — | — | — | — | — | — |
| Si Compound 2 | 30 | — | 5.00 | — | — | — | — | — | — | — |
| Si Compound 3 | 100 | — | — | 1.50 | — | — | — | — | — | — |
| Si Compound 4 | 30 | — | — | — | 5.00 | — | — | — | — | — |
| Si Compound 5 | 100 | — | — | — | — | 1.50 | — | — | — | — |
| Si Compound 6 | 100 | — | — | — | — | — | 1.50 | — | — | — |

TABLE 1-continued

Effect of Si Compounds on Selectivity of SiNx Over SiO$_2$ in the Presence of H$_2$SO$_4$

| Raw Material | Assay, wt % | Ex. 1 | Ex. 2 | Ex. 3 | Ex. 3 | Ex. 4 | Ex. 5 | Ex. 6 | Ex. 7 | Ex. 8 |
|---|---|---|---|---|---|---|---|---|---|---|
| Si Compound 7 | 30 | — | — | — | — | — | — | 5.00 | — | — |
| Si Compound 8 | 42 | — | — | — | — | — | — | — | 3.57 | — |
| Si Compound 9 | 30 | — | — | — | — | — | — | — | — | 5.00 |
| H$_2$SO$_4$ | 96 | 25.00 | 25.00 | 25.00 | 25.00 | 25.00 | 25.00 | 25.00 | 25.00 | 25.00 |
| Total | | 100.00 | 100.00 | 100.00 | 100.00 | 100.00 | 100.00 | 100.00 | 100.00 | 100.00 |
| Temperature | | 160 | 160 | 160 | 160 | 160 | 160 | 160 | 160 | 160 |
| SiNx E/R (Å/min) | | 167 | 256 | 178 | 144 | 156 | 165 | 127 | 159 | 142 |
| SiOx E/R (Å/min) | | 0.062 | 0.152 | 0.864 | 1.560 | 0.027 | −0.014 | −0.066 | −0.323 | −0.216 |
| SiN to SiO$_2$ Selectivity | | 2693.548 | 1684.211 | 206.019 | 92.308 | 5777.778 | −11785.714 | −1924.242 | −492.260 | −657.407 |

TABLE 2

Effect of Si Compounds on Selectivity of SiNx Over SiO$_2$ Without H$_2$SO$_4$

| Raw Material | Assay, wt % | Ex. 9 | Ex. 10 | Ex. 11 | Ex. 12 | Ex. 13 | Ex. 14 | Ex. 15 |
|---|---|---|---|---|---|---|---|---|
| H$_3$PO$_4$ | 85 | 100.00 | 95.00 | 95.00 | 95.00 | 95.00 | 95.00 | 95.00 |
| DIW | 100 | — | — | — | — | — | — | 1.43 |
| Si Compound 1 | 30 | — | 5.00 | — | — | — | — | — |
| Si Compound 9 | 30 | — | — | 5.00 | — | — | — | — |
| Si Compound 2 | 30 | — | — | — | 5.00 | — | — | — |
| Si Compound 4 | 30 | — | — | — | — | 5.00 | — | — |
| Si Compound 7 | 30 | — | — | — | — | — | 5.00 | — |
| Si Compound 8 | 42 | — | — | — | — | — | — | 3.57 |
| Total | | 100.00 | 100.00 | 100.00 | 100.00 | 100.00 | 100.00 | 100.00 |
| Temperature | | 160 | 160 | 160 | 160 | 160 | 160 | 160 |
| SiNx E/R (Å/min) | | 239 | 210 | 208 | 218 | 224 | 222 | 194 |
| SiOx E/R (Å/min) | | 2.230 | 0.693 | −0.207 | 1.277 | 1.827 | 0.129 | −0.518 |
| SiN to SiO2 Selectivity | | 107.175 | 303.030 | −1004.831 | 170.713 | 122.605 | 1720.930 | −374.517 |

Table 1 and Table 2 show that, with the addition of the silicon-containing oligomer, by suppressing SiO$_x$ etching rate and the selectivity of etching of the SiN$_x$ over SiO$_2$ was increased. Table 1 further shows that the addition of sulfuric acid further decreased SiO$_2$ etch rates and therefor increased the selectivity.

TABLE 3

Effect of H$_2$SO$_4$ Concentration on Selectivity of SiNx Over SiO$_2$

| Raw Material | Assay, wt % | Ex. 10 | Ex. 16 | Ex. 17 | Ex. 18 | Ex. 19 | Ex. 20 | Ex. 21 | Ex. 22 | Ex. 23 | Ex. 24 |
|---|---|---|---|---|---|---|---|---|---|---|---|
| H$_3$PO$_4$ | 85 | 95.00 | 85.00 | 80.00 | 75.00 | 72.50 | 70.00 | 67.00 | 66.00 | 63.00 | 60.00 |
| Si Comp 1 | 30 | 5.00 | 5.00 | 5.00 | 5.00 | 5.00 | 5.00 | 5.00 | 5.00 | 5.00 | 5.00 |
| H$_2$SO$_4$ | 96 | — | 10.00 | 15.00 | 20.00 | 22.50 | 25.00 | 28.00 | 29.00 | 32.00 | 35.00 |
| Total | | 100.00 | 100.00 | 100.00 | 100.00 | 100.00 | 100.00 | 100.00 | 100.00 | 100.00 | 100.00 |
| Temperature | | 160 | 160 | 160 | 160 | 160 | 160 | 160 | 160 | 160 | 160 |
| SiNx E/R (Å/min) | | 210 | 202 | 198 | 187 | 174 | 167 | 158 | 148 | 138 | 120 |
| SiOx E/R (Å/min) | | 0.693 | 0.305 | 0.156 | 0.095 | 0.085 | 0.062 | 0.025 | 0.016 | 0.011 | 0.007 |
| SiN to SiO$_2$ Selectivity | | 303.030 | 662.295 | 1269.231 | 1968.421 | 2047.059 | 2693.548 | 6320.000 | 9250.000 | 12545.455 | 17142.857 |
| H$_3$PO$_4$ wt % | | 80.750 | 72.250 | 68.000 | 63.750 | 61.625 | 59.500 | 56.950 | 56.100 | 53.550 | 51.000 |
| H$_2$SO$_4$ wt % | | 0.000 | 9.600 | 14.400 | 19.200 | 21.600 | 24.000 | 26.880 | 27.840 | 30.720 | 33.600 |
| H$_3$PO$_4$/H$_2$SO$_4$ | | — | 7.526 | 4.722 | 3.320 | 2.853 | 2.479 | 2.119 | 2.015 | 1.743 | 1.518 |

Table 3 further showed the significant effect of sulfuric acid concentration on the selectivity of SiNx over $SiO_2$.

TABLE 4

Effect of Si Compound 1 Concentration on the Selectivity of SiNx over $SiO_2$

| Raw Material | Assay, wt % | 85% $H_3PO_4$ | Ex. 25 | Ex. 26 | Ex. 27 | Ex. 28 |
|---|---|---|---|---|---|---|
| $H_3PO_4$ | 85 | 100.00 | 98.00 | 90.00 | 85.00 | 80.00 |
| Si Compound 1 | 30 | — | 2.00 | 10.00 | 15.00 | 20.00 |
| Total | | 100.00 | 100.00 | 100.00 | 100.00 | 100.00 |
| Temperature | | 160 | 160 | 160 | 160 | 160 |
| SiNx E/R (Å/min) | | 239 | 238 | 236 | 197 | 189 |
| SiOx E/R (Å/min) | | 2.230 | 0.771 | 0.300 | 0.226 | 0.196 |
| SiNx to SiOx Selectivity | | 107.175 | 308.690 | 786.667 | 871.681 | 964.286 |
| Polysilicon E/R (Å/min) | | 24.8 | — | 22.3 | — | — |

Table 4 shows with increase in Si Compound 1 concentration, the selectivity of SiNx over $SiO_2$ increased obviously by decreasing SiO2 etch rates.

TABLE 5

Evaluation of Sulfonic Acid

| Raw Material | Assay, wt % | Ex. 29 | Ex. 30 | Ex. 31 | Ex. 32 | Ex. 33 |
|---|---|---|---|---|---|---|
| $H_3PO_4$ | 85 | 90.00 | 88.00 | 85.00 | 80.00 | 75.00 |
| Si Compound 1 | 30 | 10.00 | 10.00 | 10.00 | 10.00 | 10.00 |
| Methanesulfonic Acid, MSA | 100 | — | 2.00 | 5.00 | 10.00 | 15.00 |
| Total | | 100.00 | 100.00 | 100.00 | 100.00 | 100.00 |
| Temperature | | 160 | 160 | 160 | 160 | 160 |
| SiNx E/R (Å/min) | | 236 | 200 | 199 | 196 | 182 |
| SiOx E/R (Å/min) | | 0.300 | 0.219 | 0.156 | 0.099 | 0.055 |
| SiNx to SiOx Selectivity | | 786.667 | 913.242 | 1275.641 | 1979.798 | 3309.091 |
| Polysilicon E/R (Å/min) | | 22.3 | — | — | 21.1 | 19.4 |

TABLE 6

Effect of Si Compound 1 Concentration on Selectivity of SiNx over $SiO_2$ in the Presence of Methanesulfonic Acid

| Raw Material | Assay, wt % | Ex. 34 | Ex. 35 | Ex. 36 | Ex. 37 | Ex. 38 |
|---|---|---|---|---|---|---|
| $H_3PO_4$ | 85 | 89.50 | 88.00 | 80.00 | 75.00 | 70.00 |
| Si Compound 1 | 30 | 0.50 | 2.00 | 10.00 | 15.00 | 20.00 |
| Methanesulfonic Acid | 100 | 10.00 | 10.00 | 10.00 | 10.00 | 10.00 |
| Total | | 100.00 | 100.00 | 100.00 | 100.00 | 100.00 |
| Temperature | | 160 | 160 | 160 | 160 | 160 |
| SiNx E/R (Å/min) | | 205 | 200 | 196 | 192 | 186 |
| SiOx E/R (Å/min) | | 1.121 | 0.340 | 0.099 | 0.071 | 0.035 |
| SiNx to SiOx Selectivity | | 182.872 | 588.235 | 1979.798 | 2704.225 | 5314.286 |
| Polysilicon E/R (Å/min) | | — | — | 21.1 | — | 20.5 |

Table 5 and table 6 shows methanesulfonic acid also plays the same role as sulfuric acid and the addition of methanesulfonic acid could also decrease SiO2 etch rates and increase the selectivity.

TABLE 7

Effect of Sulfuric acid Concentration on Selectivity of SiNx Over $SiO_2$ in the Presence of Methane Sulfonic Acid

| Raw Material | Assay, wt % | Ex. 39 | Ex. 40 | Ex. 41 | Ex. 42 |
|---|---|---|---|---|---|
| $H_3PO_4$ | 85 | 90.00 | 75.00 | 75.00 | 70.00 |
| Si Compound 1 | 30 | 10.00 | 10.00 | 10.00 | 5.00 |

TABLE 7-continued

Effect of Sulfuric acid Concentration on Selectivity of SiNx Over SiO$_2$ in the Presence of Methane Sulfonic Acid

| Raw Material | Assay, wt % | Ex. 39 | Ex. 40 | Ex. 41 | Ex. 42 |
|---|---|---|---|---|---|
| H$_2$SO$_4$ | 98 | — | — | 15.00 | 25.00 |
| Methanesulfonic Acid | 100 | — | 15.00 | — | — |
| Total | | 100.00 | 100.00 | 100.00 | 100.00 |
| Temperature | | 160 | 160 | 160 | 160 |
| SiNx E/R (Å/min) | | 236 | 182 | 185 | 167 |
| SiOx E/R (Å/min) | | 0.300 | 0.055 | 0.037 | 0.062 |
| SiNx to SiOx Selectivity | | 786.667 | 3309.091 | 5000.000 | 2693.548 |
| Polysilicon E/R (Å/min) | | 22.3 | 19.4 | 12.0 | 3.1 |

Table 7 shows the increase in the relative removal rates when the alkylsulfonic acid and sulfuric acid are added to the compositions of the disclosed and claimed subject matter.

TABLE 8

Effect of Organic Solvent and Surfactant on Selectivity of SiNx over SiO$_2$ with Si Compound 1

| Raw Material | Assay, wt % | Ex. 43 | Ex. 44 | Ex. 45 | Ex. 46 |
|---|---|---|---|---|---|
| H$_3$PO$_4$ | 85 | 75.00 | 70.00 | 74.00 | 74.985 |
| Si Compound 1 | 30 | 10.00 | 10.00 | 10.00 | 10.000 |
| Methanesulfonic Acid | 100 | 15.00 | 15.00 | 15.00 | 15.000 |
| Triethyleneglycoldiamine | 100 | — | 5.00 | — | — |
| 3-Morpholinopropylamine | 100 | — | — | 1.00 | — |
| Dynol 607 | 100 | — | — | — | 0.015 |
| Total | | 100.00 | 100.00 | 100.00 | 100.000 |
| Temperature | | 160 | 160 | 160 | 160 |
| SiNx E/R (Å/min) | | 182 | — | 152.000 | — |
| SiOx E/R (Å/min) | | 0.055 | — | 0.201 | — |
| SiNx to SiOx Selectivity | | 3309.091 | — | 756.219 | — |
| Polysilicon E/R (Å/min) | | 19.4 | 1.7 | 1.5 | 1.2 |

TABLE 9

Effect of Si Compound 2 on Selectivity of SiNx Over SiO$_2$

| Raw Material | RM assay, wt % | Ex. 47 | Ex. 48 |
|---|---|---|---|
| H$_3$PO$_4$ | 85 | 70.00 | 70.00 |
| Si Compound 1 | 30 | 5.00 | — |
| Si Compound 2 | 30 | — | 5.00 |
| H$_2$SO$_4$ | 98 | 25.00 | 25.00 |
| Total | | 100.00 | 100.00 |
| Temperature | | 160 | 160 |
| SiNx E/R (Å/min) | | 167 | 218 |
| SiOx E/R (Å/min) | | 0.062 | 0.129 |

The foregoing description is intended primarily for purposes of illustration. Although the disclosed and claimed subject matter has been shown and described with respect to an exemplary embodiment thereof, it should be understood by those skilled in the art that the foregoing and various other changes, omissions, and additions in the form and detail thereof may be made therein without departing from the spirit and scope of the disclosed and claimed subject matter.

What is claimed is:
1. A composition comprising:
A. neat phosphoric acid;
B. approximately 30% or greater by weight of a mixture comprising at least one of:

I. a compound of Formula I:

$$R^1R^2N-R^a-\underset{\underset{OH}{|}}{\overset{\overset{OH}{|}}{Si}}-O-\left[\underset{\underset{OH}{|}}{\overset{\overset{R^3}{|}}{Si}}-O\right]_m-\underset{\underset{OH}{|}}{\overset{\overset{OH}{|}}{Si}}-R^b-NR^4R^5$$

wherein:
(i) m=0-20,
(ii) each of $R^1$, $R^2$, $R^3$, $R^4$ and $R^5$ is independently selected from the group of hydrogen, a $C_1$ to $C_{10}$ linear alkyl group, a $C_1$ to $C_{10}$ linear alkyl group substituted with fluorine, a nitrogen-containing group, an oxygen-containing group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ╪OH, and
(iii) each of $R^a$ and $R^b$ is independently selected from a $C_1$ to $C_{10}$ linear alkyl group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ╪NH—$C_1$-$C_{10}$ alkyl, a $C_1$-$C_{10}$ alkyl substituted with ╪OH; or II. a compound of Formula II:

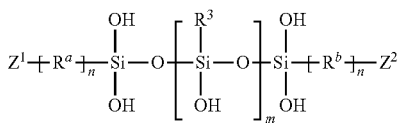

wherein:
(i) m=0-20,
(ii) n=0-20,
(iii) $R^3$ is selected from the group of hydrogen, a $C_1$ to $C_{10}$ linear alkyl group, a $C_1$ to $C_{10}$ linear alkyl group substituted with fluorine, a nitrogen-containing group, an oxygen-containing group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ┤OH, $Z^1$ and $Z^2$, and
(iv) each of $R^a$ and $R^b$ is independently selected from a $C_1$ to $C_{10}$ linear alkyl group, a $C_3$ to $C_{10}$ branched alkyl group, a $C_3$ to $C_{10}$ cyclic alkyl group, a $C_5$ to $C_{12}$ aryl group, a $C_2$ to $C_{10}$ linear or branched alkenyl group and a $C_2$ to $C_{10}$ linear or branched alkynyl group, ┤NH—$C_1$-$C_{10}$ alkyl, a $C_1$-$C_{10}$ alkyl substituted with ┤OH,
(v) $Z^1$ and $Z^2$ are each independently selected from:
a.

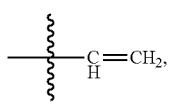 [SMILES: *C=C]

b.

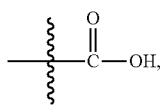 [SMILES: *C(=O)O]

c. ┤$N^+(CH_3)_3Cl$, and
d. ┤$CH(OH)CH_2OH$; and
III. an aqueous solvent.

2. The composition of claim 1, wherein the mixture further comprises at least one additional acid other than neat phosphoric acid selected from $HNO_3$, $H_2SO_4$, HCl and methane sulfuric acid.

3. The composition of claim 1, wherein (i) the mixture further comprises neat sulfuric acid and (ii) a combined content of the neat phosphoric acid and the neat sulfuric acid is between approximately 80% and approximately 85% by weight of the composition.

4. The composition of claim 1, wherein (i) the mixture further comprises sulfuric acid and (ii) a combined content of the neat phosphoric acid and the neat sulfuric acid is approximately 83.5% by weight of the composition.

5. The composition of claim 1, wherein the mixture further comprises one or more additional silicon-containing compound selected from alkylsilsesquioxanes, vinylsilsesquioxane, carboxylic acid alkylsilsesquioxane and alkyleneglycol alkylsilsesquioxane.

6. The composition of claim 1, wherein the mixture comprises a compound of Formula I.

7. The composition of claim 1, wherein the mixture comprises a compound of Formula II.

8. The composition of claim 1, wherein m in one or both of Formula I and Formula II is 0.

9. The composition of claim 1, wherein a content of the compound of Formula I is approximately 5% or less by weight.

10. The composition of claim 1, comprising a compound of Formula I, wherein
(i) the compound of Formula I comprises:

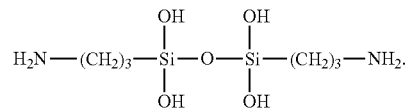

11. The composition of claim 1, comprising a compound of Formula I, wherein
(i) the compound of Formula I comprises:

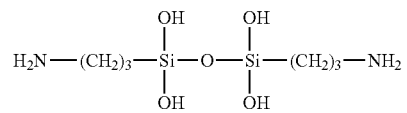

(ii) the mixture further comprises neat sulfuric acid, and
(iii) a combined content of the neat phosphoric acid and the neat sulfuric acid is between approximately 80% and approximately 85% by weight of the composition.

12. The composition of claim 1, comprising a compound of Formula I, wherein
(i) the compound of Formula I comprises:

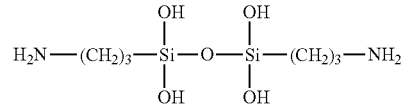

(ii) the mixture further comprises sulfuric acid, and
(iii) a combined content of the neat phosphoric acid and the neat sulfuric acid is approximately 83.5% by weight of the composition.

13. The composition of claim 1, comprising a compound of Formula I, wherein
(i) the compound of Formula I comprises:

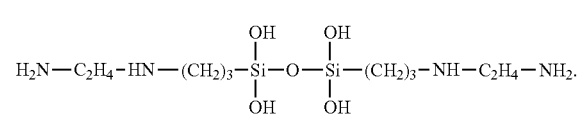

14. The composition of claim 1, comprising a compound of Formula I, wherein
(i) the compound of Formula I comprises:

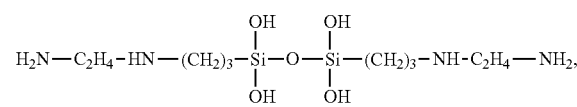

(ii) the mixture further comprises neat sulfuric acid, and
(iii) a combined content of the neat phosphoric acid and the neat sulfuric acid is between approximately 80% and approximately 85% by weight of the composition.

15. The composition of claim 1, comprising a compound of Formula I, wherein
(i) the compound of Formula I comprises:

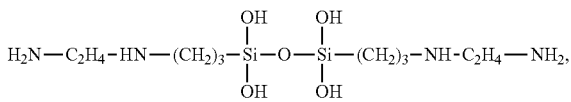

(ii) the mixture further comprises sulfuric acid, and
(iii) a combined content of the neat phosphoric acid and the neat sulfuric acid is approximately 83.5% by weight of the composition.

16. The composition of claim 1, wherein a content of the compound of Formula II is approximately 5% or less by weight.

17. The composition of claim 1, comprising a compound of Formula II, wherein
(i) the compound of Formula II comprises:

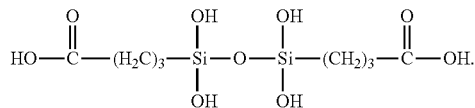

18. The composition of claim 1, comprising a compound of Formula II, wherein
(i) the compound of Formula II comprises:

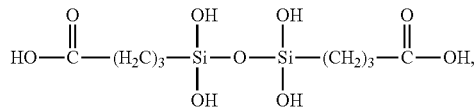

(ii) the mixture further comprises neat sulfuric acid, and
(iii) a combined content of the neat phosphoric acid and the neat sulfuric acid is between approximately 80% and approximately 85% by weight of the composition.

19. The composition of claim 1, comprising a compound of Formula II, wherein
(i) the compound of Formula II comprises:

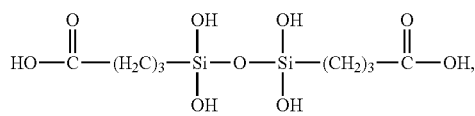

(ii) the mixture further comprises sulfuric acid, and
(iii) a combined content of the neat phosphoric acid and the neat sulfuric acid is approximately 83.5% by weight of the composition.

20. The composition of claim 1, comprising a compound of Formula II, wherein
(i) the compound of Formula II comprises:

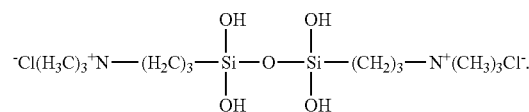

21. The composition of claim 1, comprising a compound of Formula II, wherein
(i) the compound of Formula II comprises:

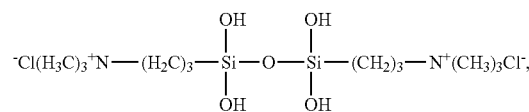

(ii) the mixture further comprises neat sulfuric acid, and
(iii) a combined content of the neat phosphoric acid and the neat sulfuric acid is between approximately 80% and approximately 85% by weight of the composition.

22. The composition of claim 1, comprising a compound of Formula II, wherein
(i) the compound of Formula II comprises:

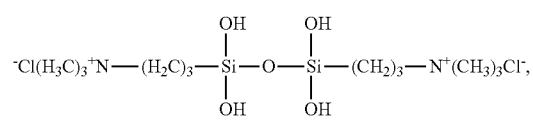

(ii) the mixture further comprises sulfuric acid, and
(iii) a combined content of the neat phosphoric acid and the neat sulfuric acid is approximately 83.5% by weight of the composition.

23. A method of selectively enhancing the etch rate of silicon nitride relative to silicon dioxide on a semiconductor substrate comprising silicon nitride and silicon dioxide, the method comprising the steps of:
a. contacting the semiconductor substrate comprising silicon nitride and silicon dioxide with the composition of claim 1; and
b. rinsing the semiconductor device after the silicon nitride is at least partially removed.

* * * * *